(12) United States Patent
Kim

(10) Patent No.: US 7,413,950 B2
(45) Date of Patent: Aug. 19, 2008

(54) METHODS OF FORMING CAPACITORS HAVING STORAGE ELECTRODES INCLUDING CYLINDRICAL CONDUCTIVE PATTERNS

(75) Inventor: Hee-Sung Kim, Seoul (KR)

(73) Assignee: Samsung Electronics Co., Ltd. (KR)

(*) Notice: Subject to any disclaimer, the term of this patent is extended or adjusted under 35 U.S.C. 154(b) by 63 days.

(21) Appl. No.: 11/033,199

(22) Filed: Jan. 11, 2005

(65) Prior Publication Data

US 2005/0152093 A1    Jul. 14, 2005

(30) Foreign Application Priority Data

Jan. 12, 2004   (KR)   ............... 10-2004-0001946

(51) Int. Cl.
   *H01L 21/8242*   (2006.01)
(52) U.S. Cl. ............... 438/253; 438/255; 257/E29.309; 257/E27.086; 257/E27.088; 257/E21.679
(58) Field of Classification Search ................. 438/255, 438/253; 257/E29.309, E27.086, E27.088, 257/E21.423, E21.679, 103
   See application file for complete search history.

(56) References Cited

U.S. PATENT DOCUMENTS

| | | | |
|---|---|---|---|
| 5,923,973 A | 7/1999 | Chen et al. | |
| 6,316,799 B1 * | 11/2001 | Kunikiyo | 257/296 |
| 6,707,096 B2 | 3/2004 | Schoenfeld et al. | |
| 2004/0166627 A1 * | 8/2004 | Lim et al. | 438/241 |
| 2004/0227175 A1 * | 11/2004 | Iijima et al. | 257/309 |

FOREIGN PATENT DOCUMENTS

| | | |
|---|---|---|
| KR | 94006587 B1 | 7/1994 |
| KR | 00244281 B1 | 11/1999 |
| KR | 000005623 A | 1/2000 |
| KR | 1020010003464 A | 1/2001 |
| KR | 10200158940 A | 7/2001 |
| KR | 1020030047578 A | 6/2003 |
| KR | 1020030094480 A | 12/2003 |

OTHER PUBLICATIONS

Korean Intellectual Office, "Notice to File a Response" corresponding to Korean Patent Application No. 10-2004-0001946, mailed Nov. 24, 2005.

* cited by examiner

*Primary Examiner*—Long K Tran
(74) *Attorney, Agent, or Firm*—Myers Bigel Sibley & Sajovec

(57) ABSTRACT

A capacitor is provided including a storage node contact pad and a storage electrode. The storage electrode includes at least two cylindrical conductive patterns. The at least two cylindrical conductive patterns are electrically coupled to a portion of a surface of the storage node contact pad. Related methods are also provided.

11 Claims, 27 Drawing Sheets

METHODS OF FORMING CAPACITORS HAVING STORAGE ELECTRODES INCLUDING CYLINDRICAL CONDUCTIVE PATTERNS

CLAIM OF PRIORITY

This application is related to and claims priority from Korean Patent Application No. 2004-1946 filed on Jan. 12, 2004, the disclosure of which is hereby incorporated herein by reference as if set forth in its entirety.

FIELD OF THE INVENTION

The present invention relates to semiconductor devices and methods of fabricating the same and, more particularly, to capacitors and methods of fabricating the same.

BACKGROUND OF THE INVENTION

Generally, semiconductor memory devices, such as dynamic random access memory (DRAM) devices, can store data or information therein. The data or information is stored in and read out from the semiconductor memory devices. A typical single memory cell of conventional semiconductor memory devices includes one capacitor and one transistor. The capacitor of the semiconductor memory device generally includes a storage electrode, a dielectric layer and a plate electrode. The larger the capacitance of the capacitor, the larger the storage capacitance of the capacitor.

As memory devices become more highly integrated, the size of the memory devices has also decreased. To provide sufficient storage capacitance of the semiconductor memory device, the capacitors typically include a plane shape in an early stage and have been gradually developed to have various shapes such as boxes, cylinders, fins, and the like. In order to increase the storage capacitance, capacitors having a double or multiple cylindrical shape have been developed and heights of the capacitors have been augmented. Capacitors illustrating various of these aspects are discussed in, for example, U.S. Pat. No. 5,923,973 and U.S. Patent Publication No. 2002-56867.

FIGS. 1A to 1E are cross-sections illustrating processing steps in the fabrication of capacitors having double cylindrical shapes as discussed in U.S. Pat. No. 5,923,973. Referring now to FIG. 1A, a substrate 5 is divided into an active region and a field region by an isolation layer 10 on the substrate 5. After a gate oxide layer 25 and a gate electrode 30 are formed on the active region, source and drain regions 15 and 20 are formed at surface portions of the substrate 5 between the gate electrodes 30.

A word line 35 is formed on the field region and a base layer 40 is formed on the substrate 5 using an oxide. A first insulating layer 45 and a second insulating layer 50 are successively formed on the base layer 40. The first insulating layer 45 may include an oxide and the second insulating layer 50 may include a nitride.

Referring now to FIG. 1B, a third insulating layer 55 is formed on the second insulating layer 50 using an oxide and the third insulating layer 55 is partially etched to form a capacitor hole exposing at least a portion of the second insulating layer 50 through the third insulating layer 55. The drain region 15 is disposed under the capacitor hole. A first conductive layer 60 including polysilicon is formed on a floor and an inner sidewall of the capacitor hole and on the third insulating layer 55.

Referring now to FIG. 1C, a fourth insulating layer 65 is formed on the first conductive layer 60 in the capacitor hole. The fourth insulating layer 65, the first conductive layer 60, the second insulating layer 50, the first insulating layer 45 and the base layer 40 are successively etched to form a contact hole exposing at least a portion of the drain region 15.

A second conductive layer 75 is formed on the fourth insulating layer 65 and the first conductive layer 60 in the contact hole. Here, a plug 70 contacting the drain region 15 is formed in the contact hole. The fourth insulating layer 65 includes an oxide and the second conductive layer 75 includes polysilicon.

Referring now to FIG. 1D, the second conductive layer 75 and the first conductive layer 60 are etched until at least a portion of the third insulating layer 55 is exposed to thereby form a storage electrode including a double cylindrical shape. The storage electrode includes the fourth insulating layer 65.

Referring now to FIG. 1E, the fourth insulating layer 65 and the third insulating layer 55 are removed to complete the storage electrode including the first conductive layer 60 and the plug 70. A dielectric layer 80 and a plate electrode 85 are successively formed on the storage electrode and the second insulating layer 50 to complete the capacitor having a double cylindrical shape.

In the above-described method, the processes for forming the capacitor may be complicated as the plug and the conductive patterns are simultaneously formed by at least two fabrication steps. Furthermore, since the plug for coupling the capacitor to the contact region is relatively high, a contact failure may occur between the capacitor and the contact region when the plug does not make precise contact with the contact region. When the contact failure of the capacitor occurs, the storage electrode of the capacitor may not be electrically coupled to the contact region and may thereby cause a failure of the semiconductor device.

Since the storage electrode of a conventional capacitor includes the plug through the cylindrical conductive layer, a surface area extension of the storage electrode may be limited. Thus, the capacitance of the capacitor including the storage electrode may also be limited. Accordingly, improved capacitors and methods of fabricating them may be desired.

SUMMARY OF THE INVENTION

Some embodiments of the present invention provide a capacitor including a storage node contact pad and a storage electrode. The storage electrode includes at least two cylindrical conductive patterns. The at least two cylindrical conductive patterns are electrically coupled to a portion of a surface of the storage node contact pad.

In further embodiments of the present invention, a semiconductor substrate is provided including a contact region. The storage node contact pad is electrically coupled to the contact region of the substrate. A dielectric layer is provided on the storage electrode and a plate electrode is provided on the dielectric layer.

In still further embodiments of the present invention, the cylindrical conductive patterns may have a matrix shape or the cylindrical conductive patterns may have a multiple cylindrical shape. The storage electrode may include a first cylindrical conductive pattern contacting the pad and a second conductive pattern dividing the first cylindrical conductive pattern into a plurality of the first conductive pattern portions.

In some embodiments of the present invention, the storage electrode has a critical dimension less than or equal to about 50 nm. In some embodiments of the present invention, the cylindrical conductive patterns may have a pyramid-shaped cross section.

While the present invention is described above primarily with reference to capacitors, methods of fabricating capacitors are also provided herein.

DETAILED DESCRIPTION OF EMBODIMENTS OF THE PRESENT INVENTION

Figure 1A:
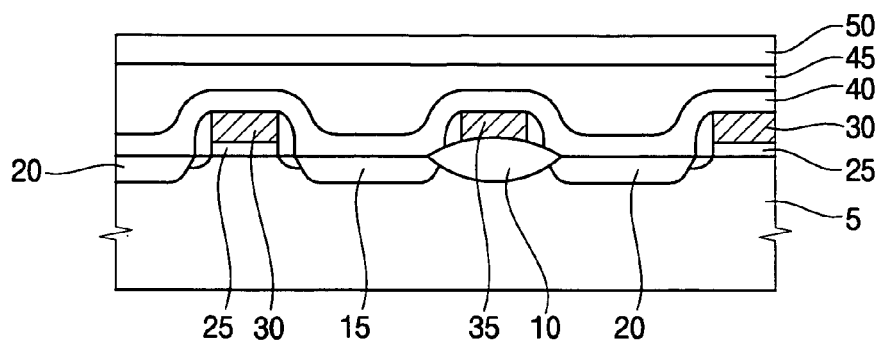
FIGS. 1A through 1E are cross-sections illustrating processing steps in the fabrication of conventional capacitors having a double cylindrical shape.
Figure 1B:
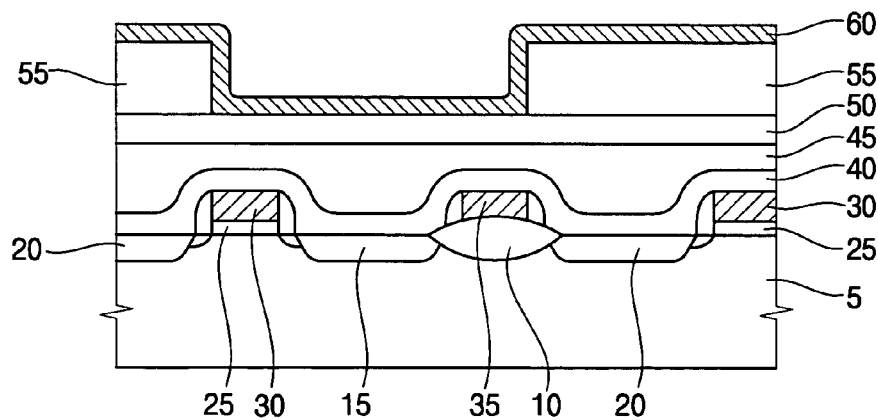
Figure 1C:
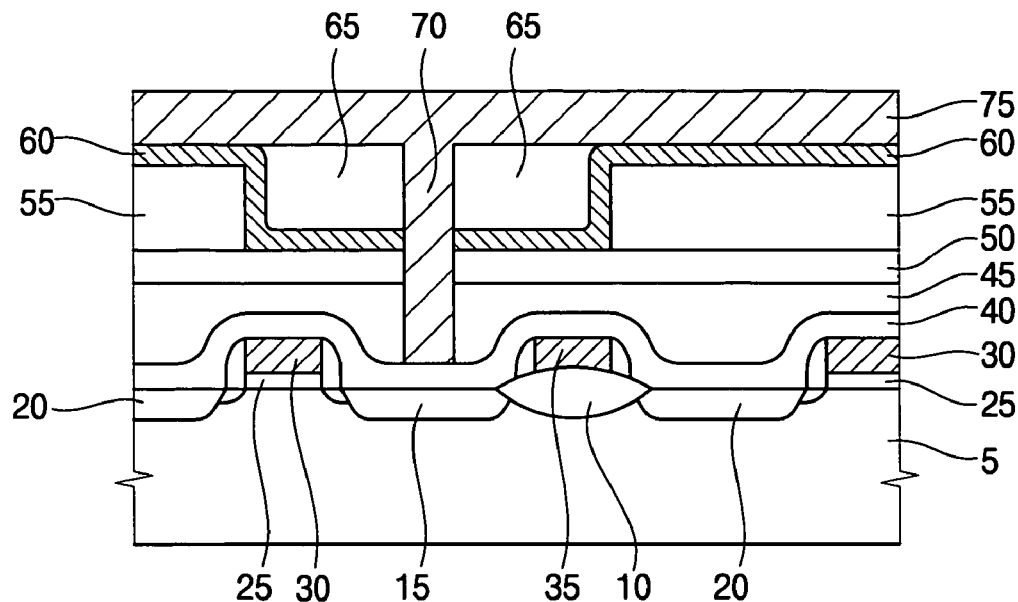
Figure 1D:
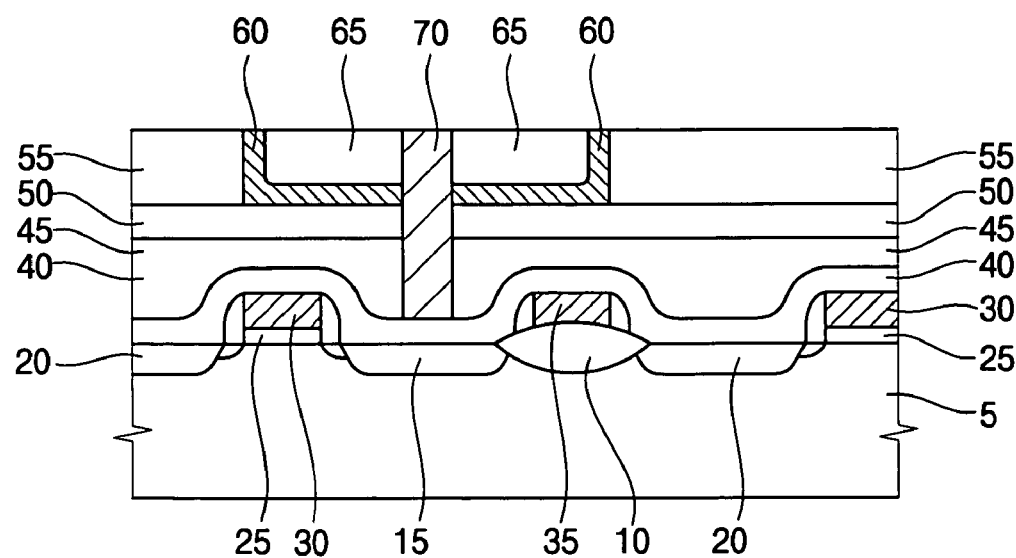
Figure 1E:
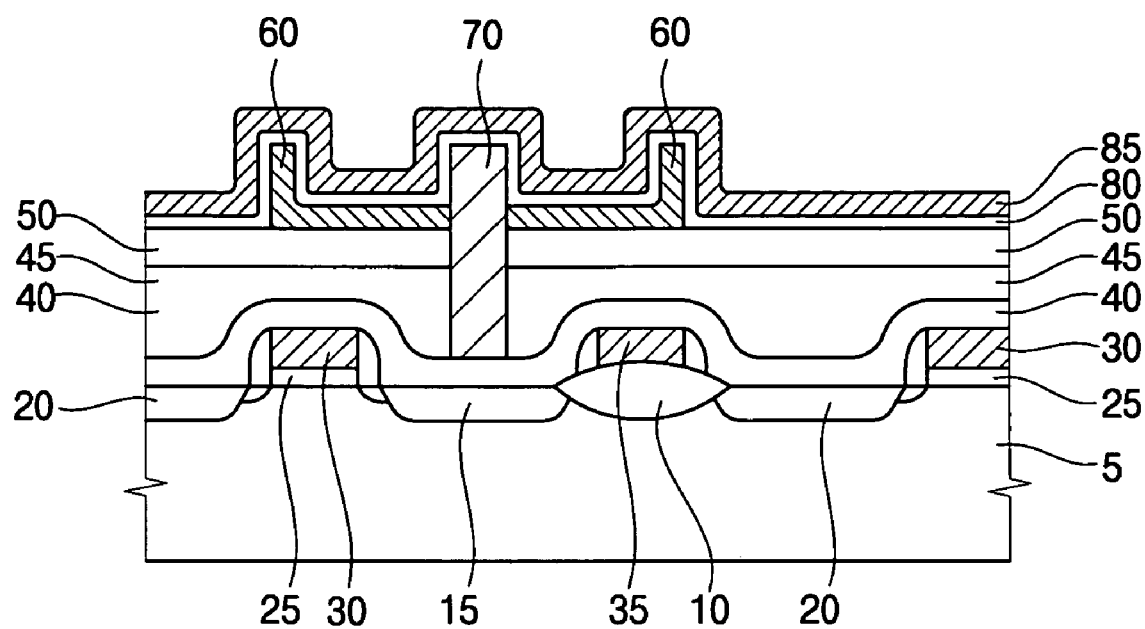

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
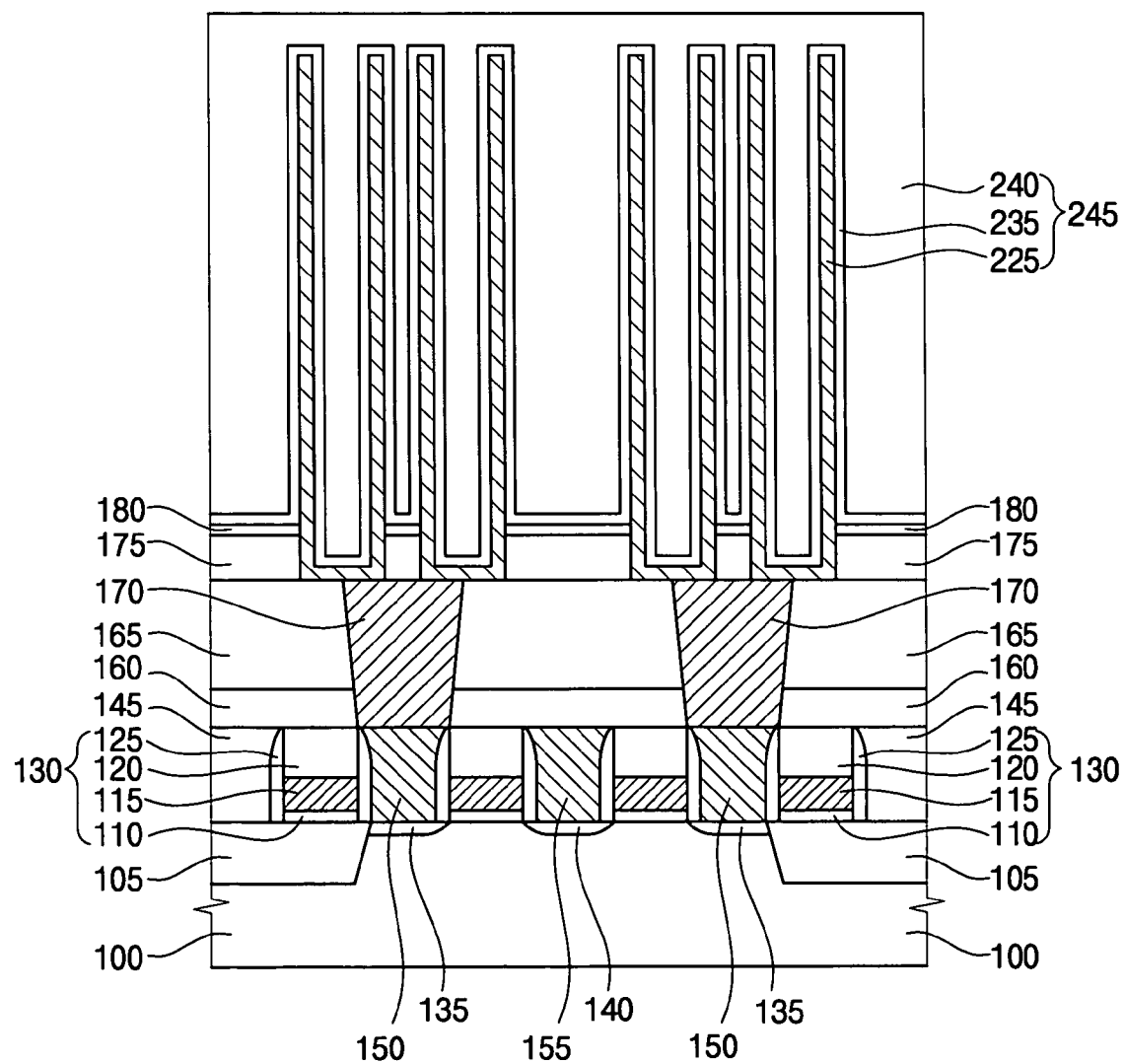
FIG. 2 is a cross-section illustrating capacitors according to some embodiments of the present invention.

FIG. 2 is a cross-section illustrating capacitors having a matrix shape or a multiple cylindrical shape according to some embodiments of the present invention. Referring now to FIG. 2, capacitor 245 is provided on a substrate 100 including conductive structures, such as word lines, bit lines, conductive pads, contact regions, and the like. The capacitor 245 includes a storage electrode 225 having a plurality of cylindrical conductive patterns, a dielectric layer 235 provided on the storage electrode 225 and a plate electrode 240 provided on the dielectric layer 235. The storage electrode 225 may include at least two cylindrical conductive patterns.

The conductive patterns contact fourth pads 170. The cylindrical conductive patterns of the storage electrode 225 may be arranged to have a matrix shape that may be electrically coupled to the fourth pads 170. In other words, at least two cylindrical conductive patterns are electrically coupled to one of the fourth pads 170. In some embodiments of the present invention, the cylindrical conductive patterns may have a multiple cylindrical shape positioned on one of the fourth pads 170 and one of the cylindrical conductive patterns may have a relatively large diameter enclosing another cylindrical conductive pattern having a relatively small diameter.

The conductive structures may include a gate structure 130, a bit line (not shown), a first pad 150, a second pad 155, and so on. For example, the gate structure 130 may include a gate oxide pattern 110, a gate conductive pattern 115, a gate mask 120, and a gate spacer 125 that are successively formed on the substrate 100.

First contact regions 135 corresponding to capacitor contact regions and a second contact region 140 corresponding to a bit line contact region are provided on surface portions of the substrate 100 between the gate structures 130, respectively. First and second pads 150 and 155 may contact the first and second contact regions 135 and 140, respectively, which may be partially exposed through a first insulating interlayer 145 that is provided on the substrate 100 including the gate structures 130.

A second insulating interlayer 160 is provided on the first insulating interlayer 145, and the bit line is formed on the second insulating interlayer 160. A third insulating interlayer 165 is provided on the second insulating interlayer 160 such that the third insulating layer is provided on the bit line. The fourth pads 170 are provided through the second insulating interlayer 160 and the third insulating interlayer 165 to contact the first pad 150. A third pad (not shown) is provided between the bit line and the second pad 155 such that the bit line is electrically coupled to the second contact region 140.

A fourth insulating interlayer 175 and an etch stop layer 180 are successively provided on the fourth pad 170 and the third insulating interlayer 165. The cylindrical conductive patterns of the storage electrode 225 are provided through the etch stop layer 180 and the fourth insulating interlayer 175, such that the cylindrical conductive patterns electrically coupled the fourth pad 170. The storage electrode 225 including the conductive patterns is electrically coupled to the first contact region 135 through the fourth pad 170 and the first pad 150.

Figure 3A:
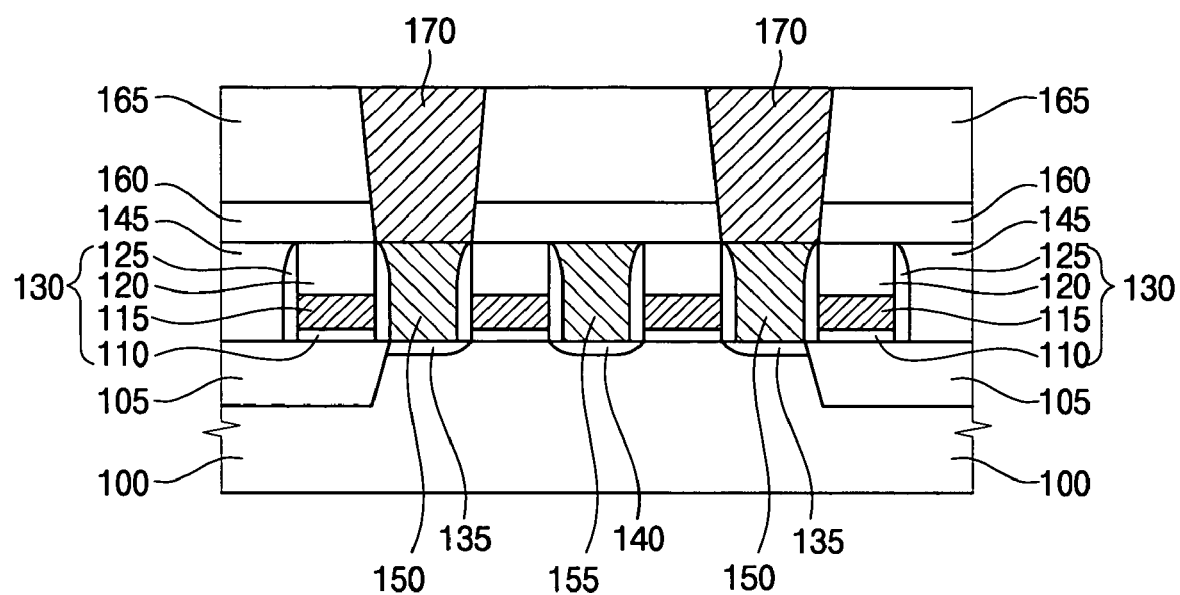
FIGS. 3A to 3G are cross-sections illustrating processing steps in the fabrication of capacitors according to embodiments of the present invention illustrated in FIG. 2.

FIGS. 3A to 3G are cross-sections illustrating processing steps in the fabrication of capacitors according to embodiments of the present invention illustrated in FIG. 2. Referring now to FIG. 3A, the semiconductor substrate 100 is divided into an active region and a field region by an isolation layer 105 on the semiconductor substrate 100. The isolation layer 105 may be formed via a shallow trench isolation (STI) process or a local oxidation of silicon (LOCOS) process without departing from the scope of the present invention.

A thin gate oxide layer (not shown) is formed on the semiconductor substrate 100 by a thermal oxidation process or a chemical vapor deposition (CVD) process. The gate oxide layer is formed on the active region defined by the isolation layer 105. A first conductive layer (not shown) and a first mask layer (not shown) are successively formed on the gate oxide layer. The first conductive layer and the first mask layer correspond to a gate conductive layer and a gate mask layer, respectively. The first conductive layer may include conductive material, such as metal or polysilicon doped with impurities. In some embodiments of the present invention, the first conductive layer may be patterned to form the gate conductive pattern 115. In further embodiments of the present invention, the first conductive layer may have a polycide structure that includes a doped polysilicon film and a metal silicide film formed on the doped polysilicon film. The first mask layer may be patterned to form the gate mask 120. The first mask layer may be formed using material that has an etching selectivity relative to the first insulating interlayer 145. For example, the first mask layer may include, for example, a nitride, such as silicon nitride and the first insulating interlayer 145 may include, for example, an oxide.

A first photoresist pattern (not shown) is formed on the first mask layer. The first mask layer, the first conductive layer and the gate oxide layer are partially etched using the first photoresist pattern as an etching mask to thereby form the gate oxide pattern 110, the gate conductive pattern 115 and the gate mask 120 on the substrate 100. In other words, the first mask layer, the first conductive layer and the gate oxide layer are successively etched, thereby forming the gate oxide pattern 110, the gate conductive pattern 115 and the gate mask 120 on the substrate 100.

In some embodiments of the present invention, the first mask layer is etched using the first photoresist pattern as an etching mask so that the gate mask 120 is formed on the first conductive layer. The first photoresist pattern is removed from the gate mask 120 using, for example, an ashing and/or a stripping process. The first conductive layer and the gate oxide layer are successively etched using the gate mask 120 as an etching mask to thereby form the gate oxide pattern 110 and the gate conductive pattern 115 on the substrate 100.

A first insulating layer (not shown) including, for example, a nitride, such as silicon nitride, is formed on the semiconductor substrate including the gate mask 120. The first insulating layer is anisotropically etched to form the gate spacer 125 on sidewalls of the gate oxide pattern 110, gate conductive pattern 115 and gate mask 120. As a result, the gate structure 130 including the gate oxide pattern 110, the gate conductive pattern 115, the gate mask 120 and the gate spacers 125 are formed on the semiconductor substrate 100.

Impurities are implanted into the surface portions of the semiconductor substrate 100 exposed between the gate structures 130 using, for example, an ion implantation process. The implanted impurities are thermally treated to thereby form the first contact regions 135 and the second contact region 140 on the exposed portions of the semiconductor substrate 100. The first and second contact regions 135 and 140 correspond to source/drain regions, respectively. The first and second contact regions 135 and 140 also correspond to the capacitor contact regions and the bit line contact region, respectively.

The first pads 150 for the capacitor 245 are electrically coupled to the capacitor contact regions and the second pad 155 for the bit line is electrically coupled to the bit line contact region. For example, the first contact region 135 may be the capacitor contact region with which the first pad 150 makes contact and the second contact region 140 may be the bit line contact region with which the second pad 155 makes contact.

As illustrated in FIG. 3A, the first insulating interlayer 145 is formed on the semiconductor substrate 100 to cover the gate structures 130. The first insulating interlayer 145 may include, for example, an oxide, such as boro-phosphor silicate glass (BPSG), phosphor silicate glass (PSG), undoped silicate glass (USG), spin on glass (SOG), tetraethylorthosilicate (TEOS), high density plasma-chemical vapor deposition (HDP-CVD) oxide and any combination thereof without departing from the scope of the present invention.

The first insulating interlayer 145 may be planarized by a chemical mechanical polishing (CMP) process, an etch back process, or a combination process of a CMP process and an etch back process until at least portions of upper faces of the gate structures 130 are exposed. A second photoresist pattern (not shown) is formed on the planarized first insulating interlayer 145. The first insulating interlayer 145 is partially etched using the second photoresist pattern as an etching mask to form first contact holes (not shown) exposing at least portions of the first and second contact regions 135 and 140, respectively. For example, the first insulating interlayer 145 may include an oxide. The first insulating interlayer 145 is etched using an etching gas that has a high etching selectivity relative to the gate mask 120 including a nitride. Some of the first contact holes expose at least a portion of the first contact regions 135 corresponding to the capacitor contact regions and others of the first contact holes expose at least a portion of the second contact regions 140 corresponding to the bit line contact regions.

After removing the second photoresist pattern using, for example, an ashing and/or a stripping process, a second conductive layer (not shown) is formed on the first insulating layer 145 in the first contact holes. The second conductive layer may be formed of polysilicon highly doped with impurities, a metal compound, such as titanium nitride (TiN), or a metal, such as tungsten (W), copper (Cu), aluminum (Al), tantalum (Ta) or a combination thereof.

The second conductive layer is etched by a CMP process, an etch back process, or a combination process of a CMP process and an etch back process until the first insulating interlayer 145 is exposed. Thus, first and second pads 150 and 155 in the first contact holes are formed on the first and second contact regions 135 and 140, respectively. Each of the first pads 150 corresponding to a first storage node contact pad contacts the first contact region 135, and each of the second pads 155 corresponding to a first bit line contact pad contacts the second contact region 140. A second insulating interlayer 160 is formed on the first insulating interlayer 145 including the first and second pads 150 and 155. The second insulating interlayer 160 electrically isolates the first pads 150 from the bit lines (not shown) successively formed on the second insulating interlayer 160. The second insulating interlayer 160 may be formed using BPSG, PSG, USG, TEOS, SO, HDP-CVD oxide or any combination thereof. In some embodiments of the present invention, the second insulating interlayer 160 may be formed using one of BPSG, PSG, USG, TEOS, SOG or HDP-CVD substantially similar to that of the first insulating interlayer 145. In further embodiments of the present invention, the second insulating interlayer 160 may be formed using one of BPSG, PSG, USG, TEOS, SOG or HDP-CVD substantially different from that of the first insulating interlayer 145.

In some embodiments of the present invention, the second insulating interlayer 160 may be planarized by a CMP process, an etch back process, or a combination of a CMP process and an etch back process. A third photoresist pattern (not shown) is formed on the second insulating interlayer 160, the second insulating layer 160 is partially etched using the third photoresist pattern as an etching mask to form second contact holes (not shown) that expose the second pads 155 therethrough. The second contact holes correspond to bit line contact holes for electrically coupling the second pads 155 to the bit lines subsequently formed on the second insulating interlayer 160, respectively.

In further embodiments of the present invention, a first anti-reflective layer (ARL) may be additionally formed between the second insulating interlayer 160 and the third photoresist pattern. The first ARL may be formed using silicon oxide, silicon nitride, silicon oxynitride or any combination thereof. The photolithography process may be carried out to form the second contact holes through the second insulating interlayer 160.

The third photoresist pattern may be removed using, for example, an ashing and/or a stripping process. A third conductive layer (not shown) and a bit line mask layer (not shown) are successively formed on the second insulating interlayer 160 in the second contact holes. The third conductive layer and the bit line mask layer are patterned to form bit line conductive patterns (not shown) and bit line masks (not shown), respectively.

A fourth photoresist pattern (not shown) is formed on the bit line mask layer. The bit line mask layer and the third conductive layer are subsequently etched using the fourth photoresist pattern as an etching mask to form the bit lines on the second insulating interlayer 160. Third pads (not shown) in the second contact holes are simultaneously formed. Each of the bit lines includes the bit line mask and the bit line conductive pattern. The third pads correspond to second bit line contact pads that electrically couple the second pads 155 to the bit lines. Each of the bit line conductive patterns may include a first film and a second film formed on the first film. The first film may include a metal and a metal compound, such as titanium/titanium nitride (Ti/TiN), and the second film may include a metal, such as tungsten (W). Each of the bit line masks protects the bit line conductive pattern during an etching process for forming a storage node contact hole 210 (see FIG. 3D). The bit line mask may be formed using material that has an etching selectivity relative to oxide in the fourth insulating interlayer 175 and a mold layer 185 (see FIG. 3D). For example, the bit line mask is formed using a nitride, such as silicon nitride. In some embodiments of the present invention, the bit line mask layer is patterned using the fourth photoresist pattern as an etching mask to form the bit line mask on the third conductive layer. The fourth photoresist pattern is removed and the third conductive layer is patterned using the bit line mask as an etching mask to thereby form the bit line conductive patterns on the second insulating interlayer 160. Here, the third pads are simultaneously formed in the second contact holes to electrically couple the bit line conductive patterns to the second pads 155, respectively.

In some embodiments of the present invention, after an additional conductive layer is formed on the second insulating interlayer 160 in the second contact holes, the additional conductive layer is etched until the second insulating interlayer 160 is at least partially exposed. Hence, the third pads contacting the second pads 155 are formed in the second contact holes. Subsequently, the third conductive layer and the bit line mask layer are formed on the second insulating interlayer 160 including the third pads. The third conductive layer and the bit line mask layer are patterned to form the bit lines as described above.

A second insulating layer (not shown) is formed on the second insulating interlayer 160 and the bit lines. The second insulating layer is anisotropically etched to form bit line spacers (not shown) on sidewalls of the bit lines. The bit line spacers protect the bit lines in a subsequent etching process for forming the fourth pads 170 that correspond to second storage node contact pads. The bit line spacers may include a material that has an etching selectivity relative to the second insulating interlayer 160 and a third insulating interlayer 165 successively formed. For example, the bit line spacers may include a nitride such as silicon nitride.

As further illustrated in FIG. 3A, a third insulating interlayer 165 is formed on the second insulating interlayer 160. The third insulating interlayer 165 may be formed using BPSG, USG, PSG, TEOS, SOG, HDP-CVD oxide or any combination thereof. In some embodiments of the present invention, the third insulating interlayer 165 may be formed using material substantially identical to that of the second insulating interlayer 160. In further embodiments of the present invention, the third insulating interlayer 165 may include material substantially different from that of the second insulating interlayer 160. For example, the third insulating interlayer 165 may be formed using HDP-CVD oxide that may advantageously be provided in gaps between the bit lines without voids therein at a low temperature.

The third insulating interlayer 165 is etched by a CMP process, an etch back process or a combination process of a CMP process and an etch back process until at least portions of upper faces of the bit lines are exposed, thereby planarizing the third insulating interlayer 165. In some embodiments of the present invention, the third insulating interlayer 165 may be planarized without exposure of the bit lines. Here, the third insulating interlayer 165 has a predetermined height from the upper faces of the bit lines.

In some embodiments of the present invention, to reduce the likelihood of generation of voids in the third insulating interlayer 165 between adjacent bit lines, an additional insulating layer may be formed on the second insulating interlayer 160 including the bit lines. The third insulating interlayer 165 is formed on the additional insulating layer. Here, the additional insulating layer may have a thickness of about 50 to about 200 Å. The additional insulating layer may be formed using a nitride.

A fifth photoresist pattern (not shown) is formed on the planarized third insulating interlayer 165. The third insulating interlayer 165 and the second insulating interlayer 160 are partially etched using the fifth photoresist pattern as an etching mask to form third contact holes (not shown) through the third insulating interlayer 165 and the second insulating interlayer 160. The third contact holes expose the first pads 150, respectively. Here, the third contact holes are self-aligned relative to the bit line spacers positioned on the sidewalls of the bit lines.

In some embodiments of the present invention, a second ARL may be additionally formed on the third insulating interlayer 165 to ensure a process margin of a subsequent photolithography process. The third insulating interlayer 165 may be etched to form the third contact holes. In some embodiments of the present invention, after forming the third contact holes through the third insulating interlayer 165 and the second insulating interlayer 160, an additional cleaning process may be performed against the semiconductor substrate 100 including the resultant structure. As a result, a native oxide layer, polymer or various particles remaining on the first pads 150 may be removed from the first pads 150.

A fourth conductive layer (not shown) is formed on the third insulating interlayer 165 in the third contact holes. The fourth conductive layer is etched by a CMP process, an etch back process or a combination of a CMP process and an etch back process until the third insulating interlayer 165 and the upper faces of bit lines are at least partially exposed. Thus, the fourth pads 170 formed in the third contact holes are formed through the third insulating interlayer 165 and the second insulating interlayer 160. The fourth pads 170 correspond to second storage node contact pads. The fourth pads 170 are generally formed using doped polysilicon or a metal, such as tungsten (W), copper (Cu), aluminum (Al), tantalum (Ta) or any combination thereof. Each of the fourth pads 170 electrically couples the first pad 150 to a storage electrode 225 (see FIG. 3F) successively formed on the fourth pad 170. Hence, the storage electrodes 225 are electrically coupled to the first contact regions 135 through the fourth pads 170 and the first pads 150, respectively.

Figure 3B:
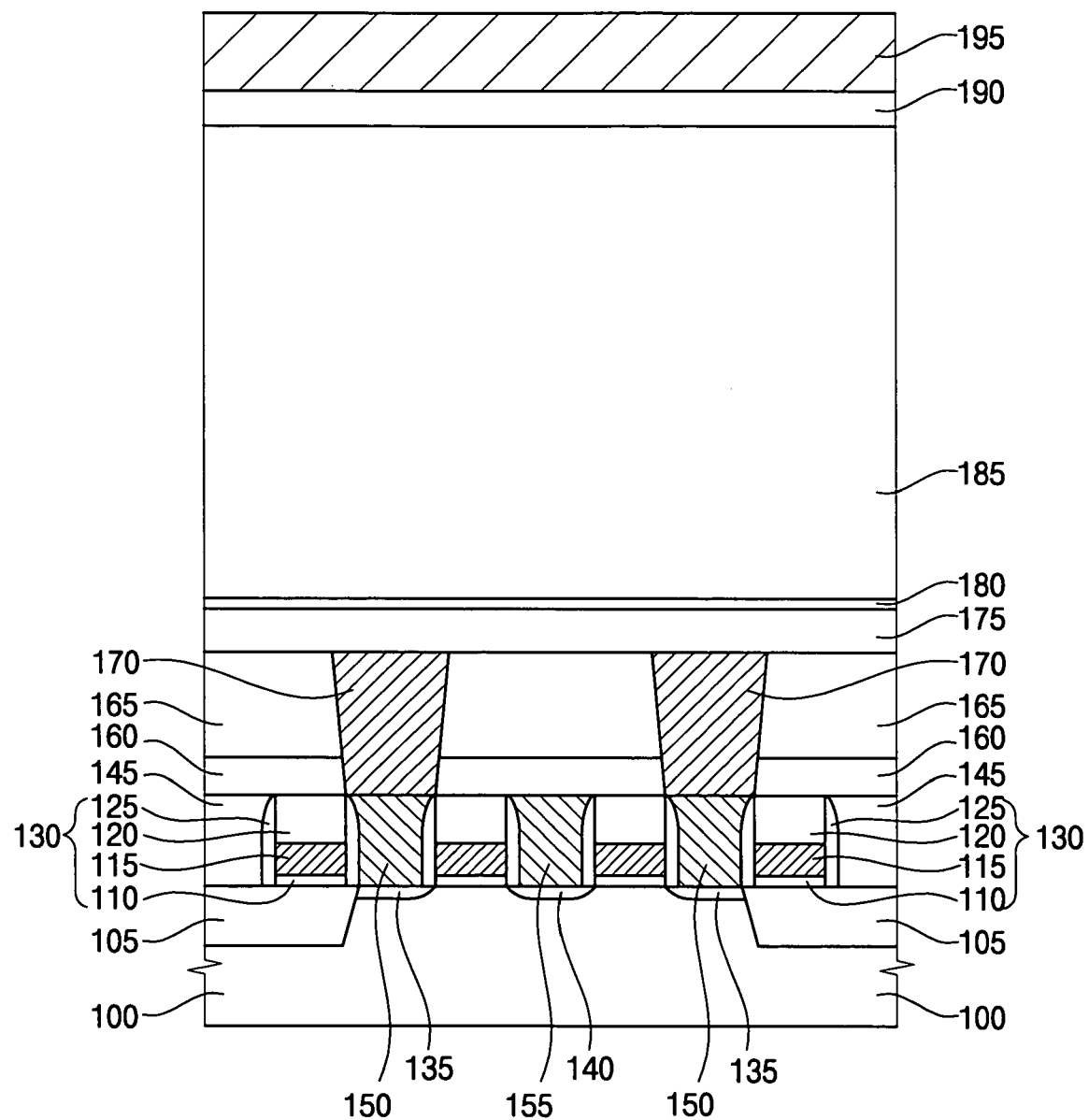

Referring now to FIG. 3B, a fourth insulating interlayer 175 is formed on the third insulating interlayer 165 and on the fourth pads 170. The fourth insulating interlayer 175 may be formed using BPSG, PSG, USG, TEOS, SOG, HDP-CVD oxide or any combination thereof. The fourth insulating interlayer 175 electrically isolates the bit lines from the storage electrodes 225 successively formed on the fourth pad 170. In some embodiments of the present invention, the fourth insulating interlayer 175 may be formed using a material substantially identical to that of the third insulating interlayer 165 and/or that of the second insulating interlayer 160. In further embodiments of the present invention, the fourth insulating interlayer 175 may be formed using a material substantially different from that of the third insulating interlayer 165 and/or that of the second insulating interlayer 160.

The etch stop layer 180 is formed on the fourth insulating interlayer 175. The etch stop layer 180 may be formed using a material that has an etching selectivity relative to the fourth insulating interlayer 175 and the mold layer 185 (i.e. a material that shows a very low etching rate compared to the fourth insulating interlayer 175 and the mold layer 185 in a specific etching condition). For example, the etch stop layer 175 may include a nitride, such as silicon nitride.

In some embodiments of the present invention, the fourth insulating interlayer 175 may be planarized by a CMP process, an etch back process or a combination of a CMP process and an etch back process and the etch stop layer 180 may be formed on the planarized fourth insulating interlayer 175.

The mold layer 185 is formed on the etch stop layer 180. The mold layer 185 is provided to form the storage electrodes 225. The mold layer 185 may be formed using TEOS, HDP-CVD oxide, PSG, USG, BPSG, PSG, OSG or a combination thereof. Preferably, the mold layer 185 may be formed using TEOS. The mold layer 185 has a thickness of from about 5,000 to about 50,000 Å measured from an upper face of the etch stop layer 180. According to some embodiments of the present invention, the thickness of the mold layer 185 may vary in accordance with desired capacitance of capacitors 245 (see FIGS. 2 and 3G). That is, because the capacitors 245 have height in proportion to the thickness of the mold layer 185, the thickness of the mold layer 185 maybe advantageously adjusted so as to control the capacitance of the capacitors 245.

As illustrated in FIG. 3B, a storage mask layer 190 is formed on the mold layer 185. The storage mask layer 190 may be formed using a material that has an etching selectivity relative to the mold layer 185. For example, the storage mask layer 190 may include polysilicon or a nitride, such as silicon nitride. A photoresist film 195 for forming the storage electrodes 225 in the mold layer 185 is formed on the storage mask layer 190. Alternatively, in some embodiments of the present invention, the photoresist film 195 may be directly formed on the mold layer 185 without forming the storage mask layer 190. Here, the photoresist film 195 may have a sufficient thickness to form fourth contact holes 210 corresponding storage contact holes.

Figure 3C:
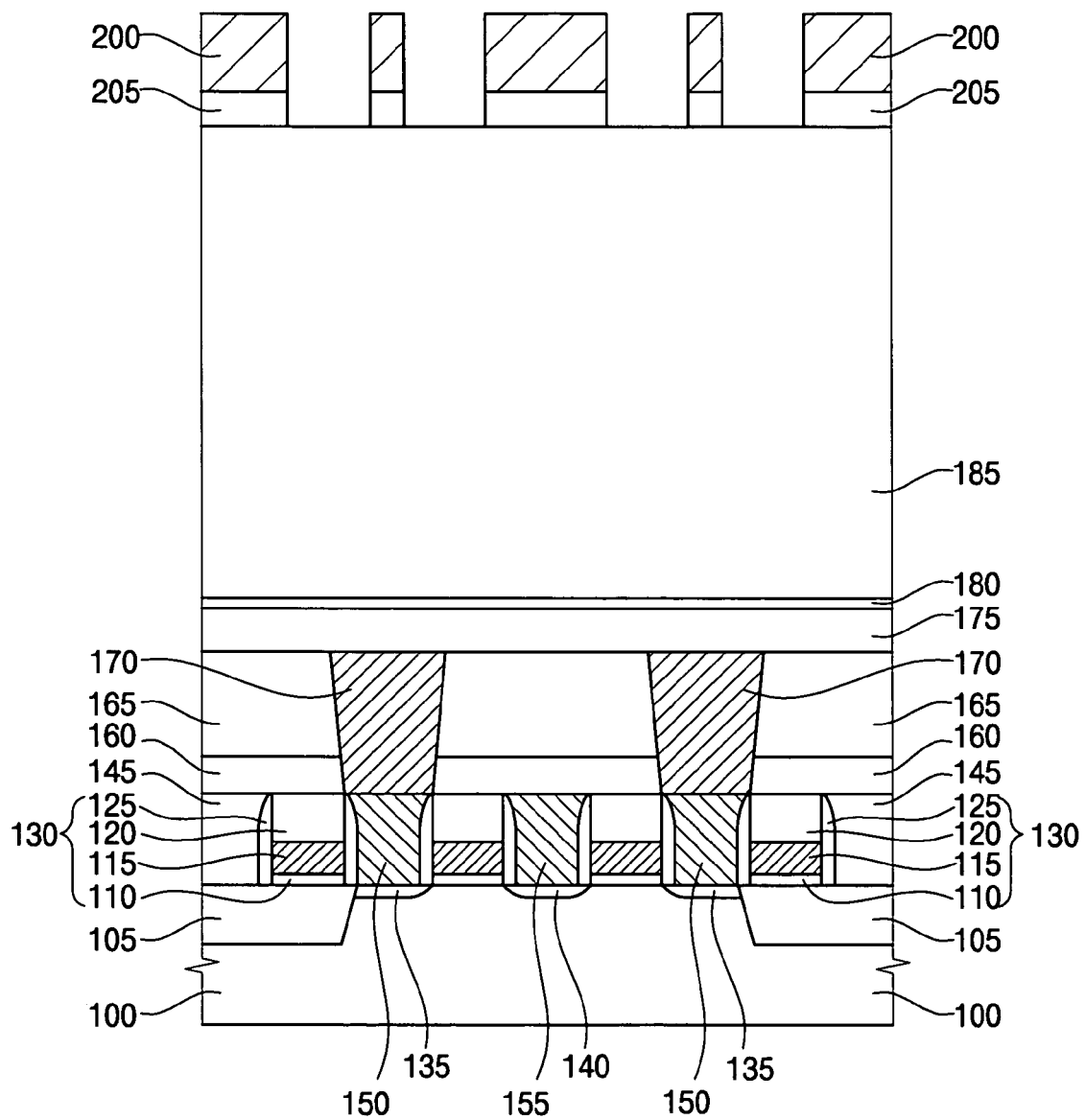

Referring now to FIG. 3C, the photoresist film 195 is patterned to form a sixth photoresist pattern 200 on the storage mask layer 190. Alternatively, a third ARL (not shown) may be additionally formed on the storage mask layer 190 to ensure a process margin of a subsequent photolithography process. The sixth photoresist pattern 200 is formed on the third ARL. The storage mask layer 190 is etched using the sixth photoresist pattern 200 as an etching mask to form a storage mask 205 on the mold layer 185. The storage mask 205 defines portions of the mold layer 185 where the storage electrodes 225 are formed therethrough. The sixth photoresist pattern 200 is removed in the etching process for forming the fourth contact holes 210. Alternatively, in some embodiments of the present invention, the sixth photoresist pattern may be removed by an ashing and/or a stripping process.

Figure 3D:
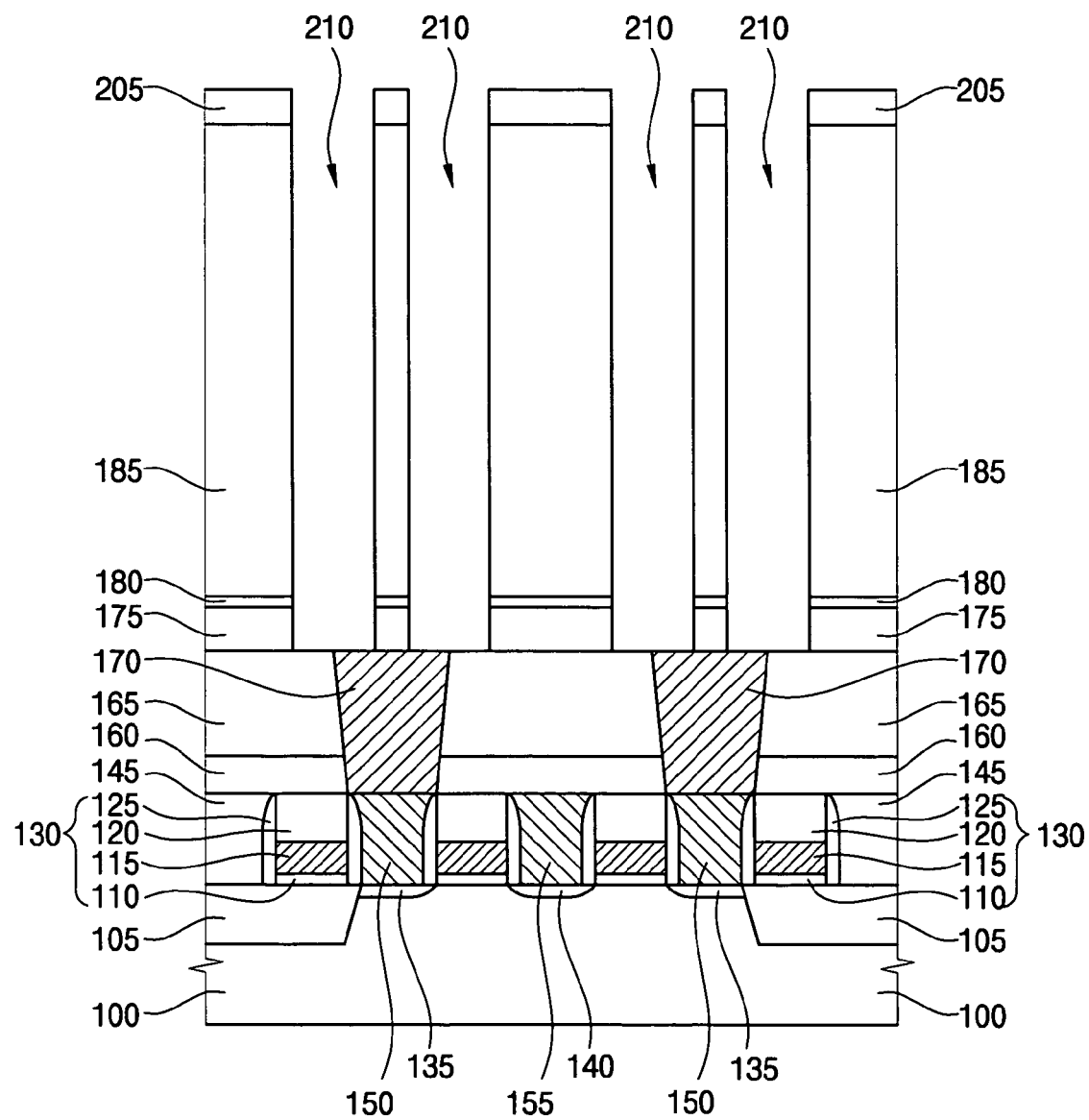

Referring now to FIG. 3D, the mold layer 185, the etch stop layer 180 and the fourth insulating interlayer 175 is partially etched using the storage mask 205 as an etching mask to form the fourth contact holes 210. The fourth contact holes 210 expose the fourth pads 170. Each of the fourth contact holes 210 partially exposes the fourth pads 170, respectively. Here, at least two of the fourth contact holes 210 expose one of the fourth pads 170. That is, one of the fourth contact holes 210 exposes one portion of the fourth pads 170 and another fourth contact hole 210 exposes another portion of the fourth pads 170. For example, two, four, six, nine, twelve, fifteen, twenty, twenty five or more fourth contact holes 210 expose one of the fourth pads 170 in accordance with the structures of the sixth photoresist pattern 200 and the storage mask 205.

Figure 3E:
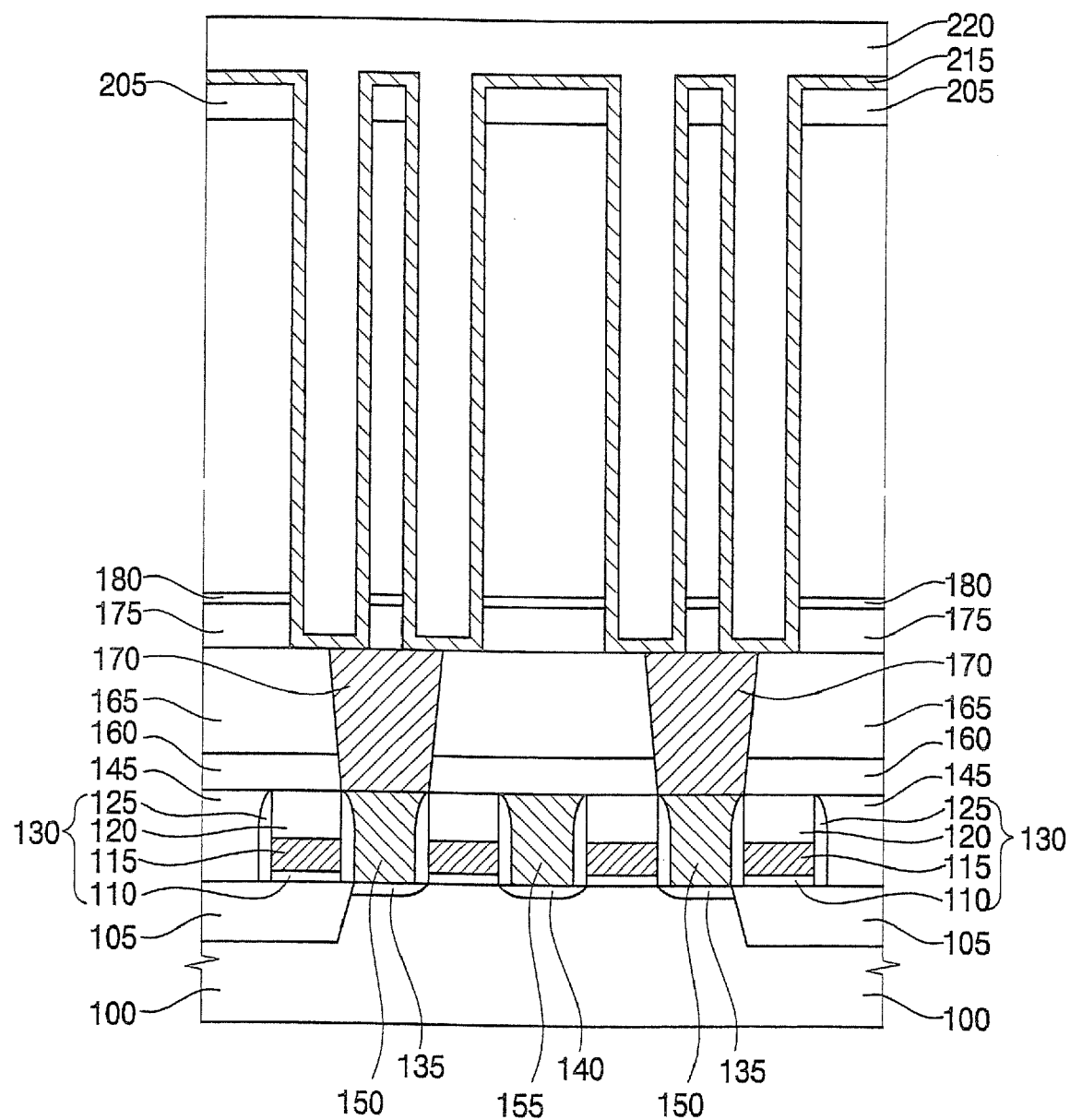

Referring now to FIG. 3E, a fifth conductive layer 215 is formed on the exposed upper face of the fourth contact pads 170, inner walls of the fourth contact holes 210 and the storage mask 205. The fifth conductive layer 215 may be formed using doped polysilicon or metal. Because at least two of the fourth contact holes 210 are positioned on one of the fourth pads 170, at least two portions of one of the fourth pads 170 contact the fifth conductive layer 215.

A sacrificial layer 220 is formed on the fifth conductive layer 215 in the fourth contact holes 210. The sacrificial layer 220 may be formed using a material having an etching selectivity relative to the mold layer 185 such as USG, SOG and the like. The sacrificial layer 220 protects the storage electrodes 225 in a subsequent etching process. In some embodiments of the present invention, an upper face of the sacrificial layer 220 is planarized by a CMP process, an etch back process or a combination of a CMP process and an etch back process.

Figure 3F:
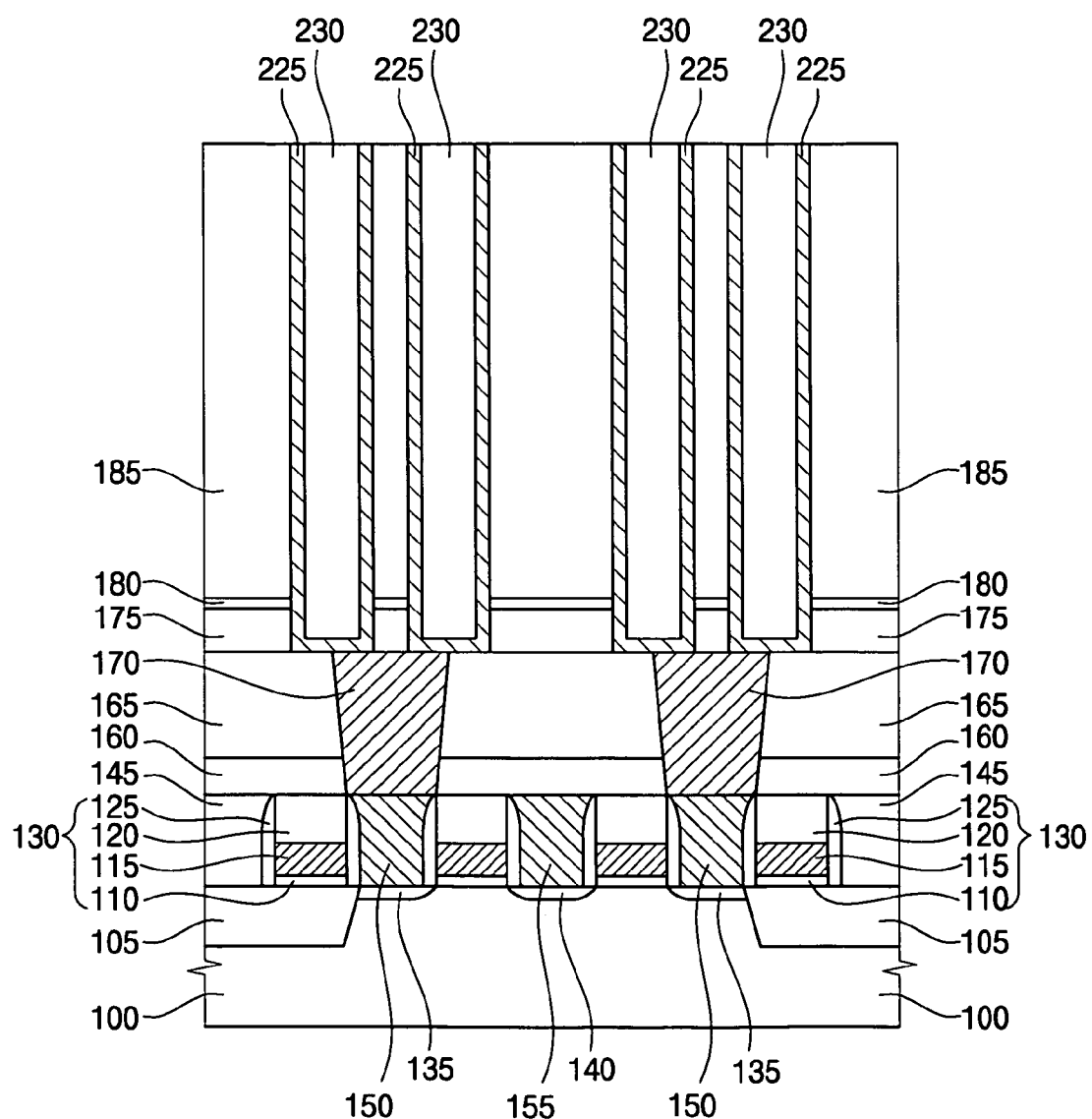

Referring now to FIG. 3F, the sacrificial layer 220, the fifth conductive layer 215 and the storage mask 205 are etched by a CMP process, an etch back process or a combination of a CMP process and an etch back process until the mold layer 185 is exposed, thereby forming the storage electrode 225 including the cylindrical conductive patterns that make respective contact with one of the fourth pads 170. Here, the conductive patterns of each storage electrode 225 are covered with sacrificial patterns 230.

Figure 3G:
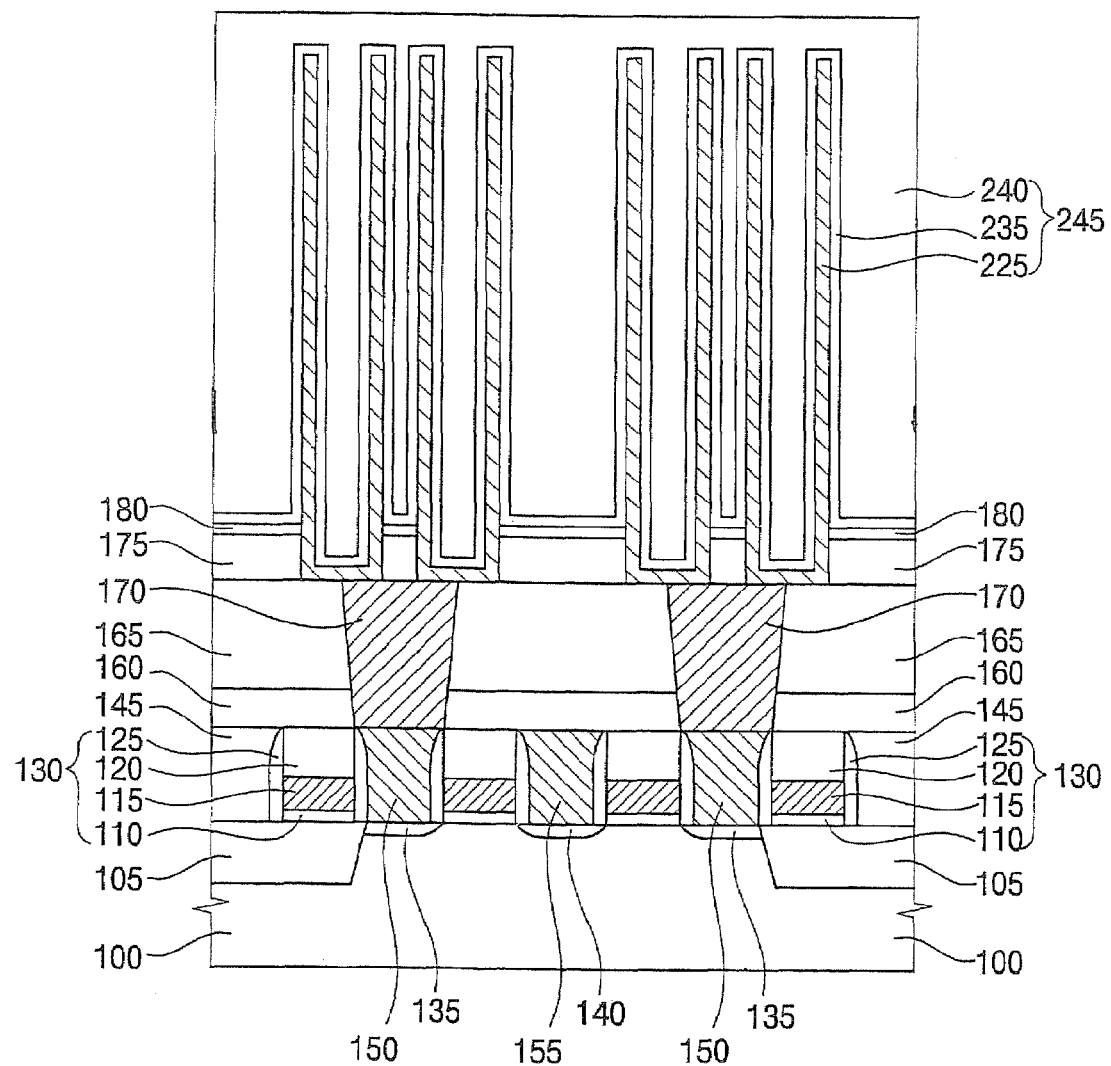

Referring now to FIG. 3G, the mold layer 185 and the sacrificial patterns 230 are etched to complete storage electrodes 225. The dielectric layer 235 and the plate electrode 240 are successively formed on the storage electrode 225 to complete the capacitor 245. As described above, the capacitor 245 according to the present embodiment includes at least two cylindrical conductive patterns electrically coupled to one of the fourth pads 170. That is, since the capacitor 245 includes the storage electrode 225 having the matrix shape or the multiple cylindrical shape, the capacitor 245 may have an improved capacitance relative to that of a conventional capacitor.

FIGS. 4A to 4F are cross-sections illustrating processing steps in the fabrication of capacitors having a matrix shape or a multiple cylindrical shape according to some embodiments of the present invention. The processing steps for forming the fourth pads 170 are substantially identical to those described above with respect to FIG. 3A and, therefore these processing steps will not be discussed in further detail herein.

Figure 4A:
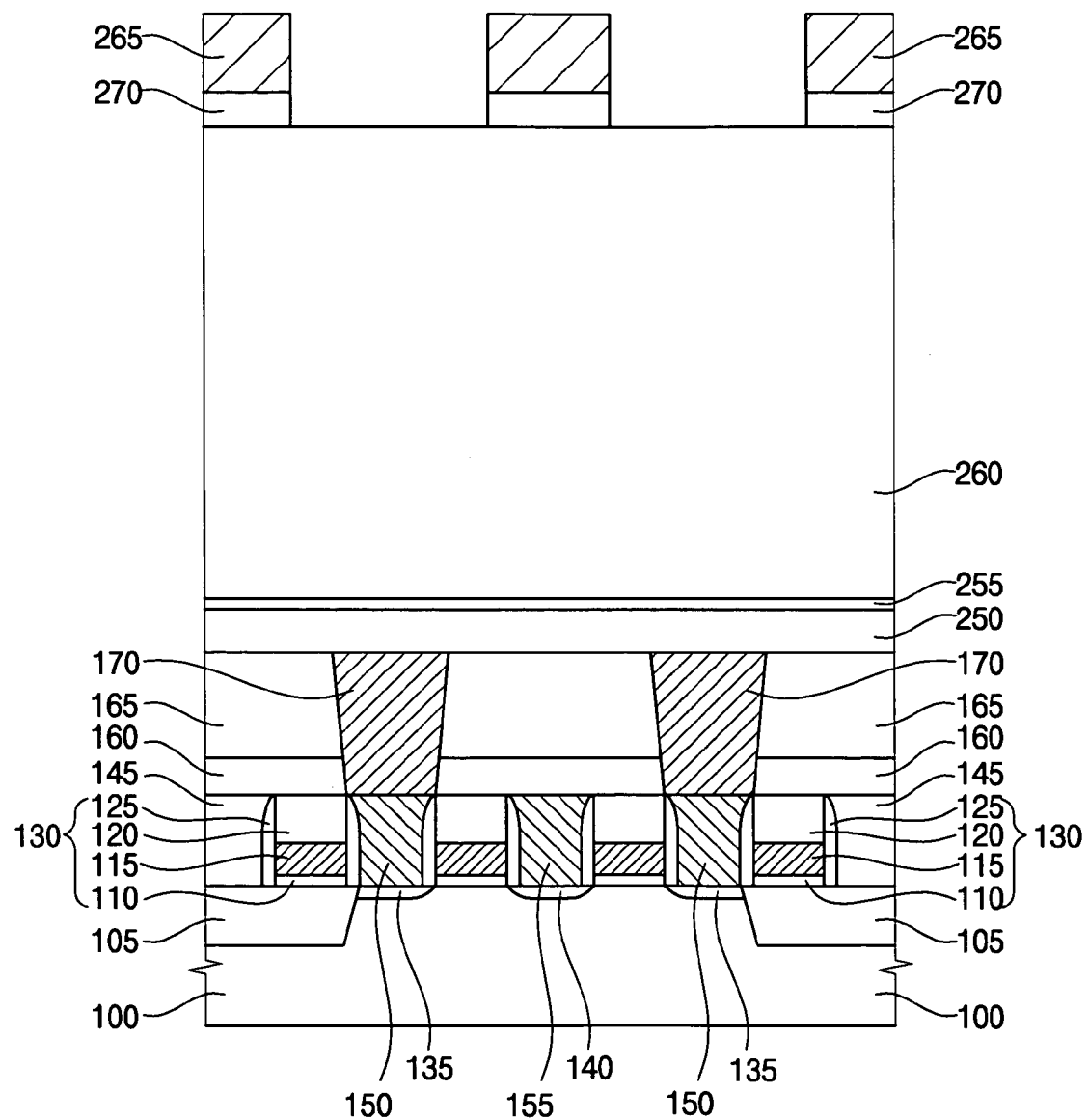
FIGS. 4A to 4F are cross-sections illustrating processing steps in the fabrication of capacitors according to further embodiments of the present invention.

Referring now to FIG. 4A, a fourth insulating interlayer 250 is formed on a fourth pad 170 and a third insulating interlayer 165 using BPSG, PSG, USG, TEOS, SO, HDP-CVD oxide or any combination thereof. As described above, the fourth insulating interlayer 250 may be formed using material substantially identical to that of the third insulating interlayer 165 and/or a second insulating interlayer 160. Alternatively, in some embodiments of the present invention, the fourth insulating interlayer 250 may include material substantially different from that of the third insulating interlayer 160 and/or the second insulating interlayer 160.

An etch stop layer 255 is formed on the fourth insulating interlayer 250. The etch stop layer 255 may be formed using material having an etching selectivity relative to a mold layer 260 successively formed and the fourth insulating interlayer 250. For example, the etch stop layer 255 is formed using a nitride, such as silicon nitride.

Figure 4B:
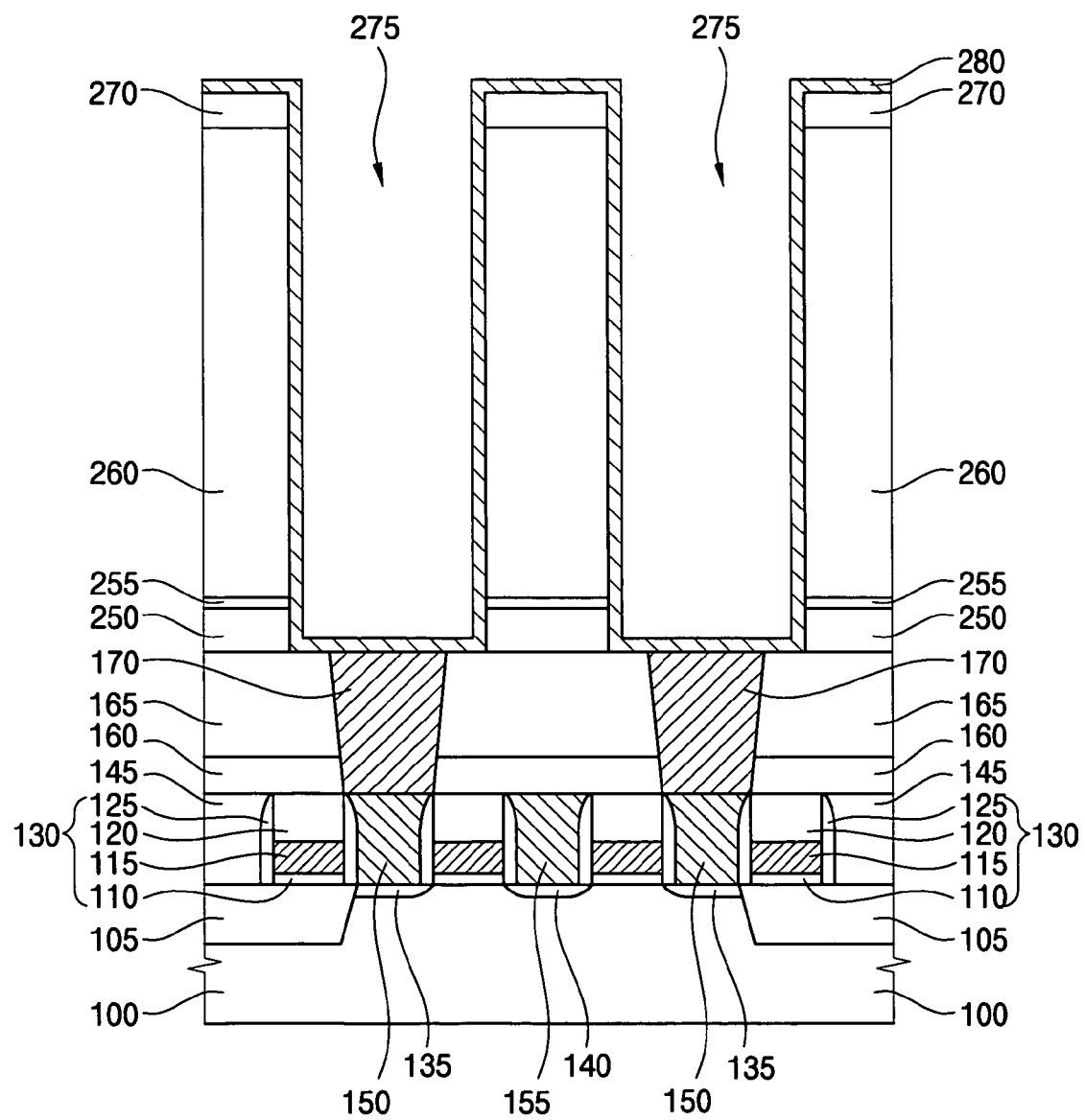
Figure 4C:
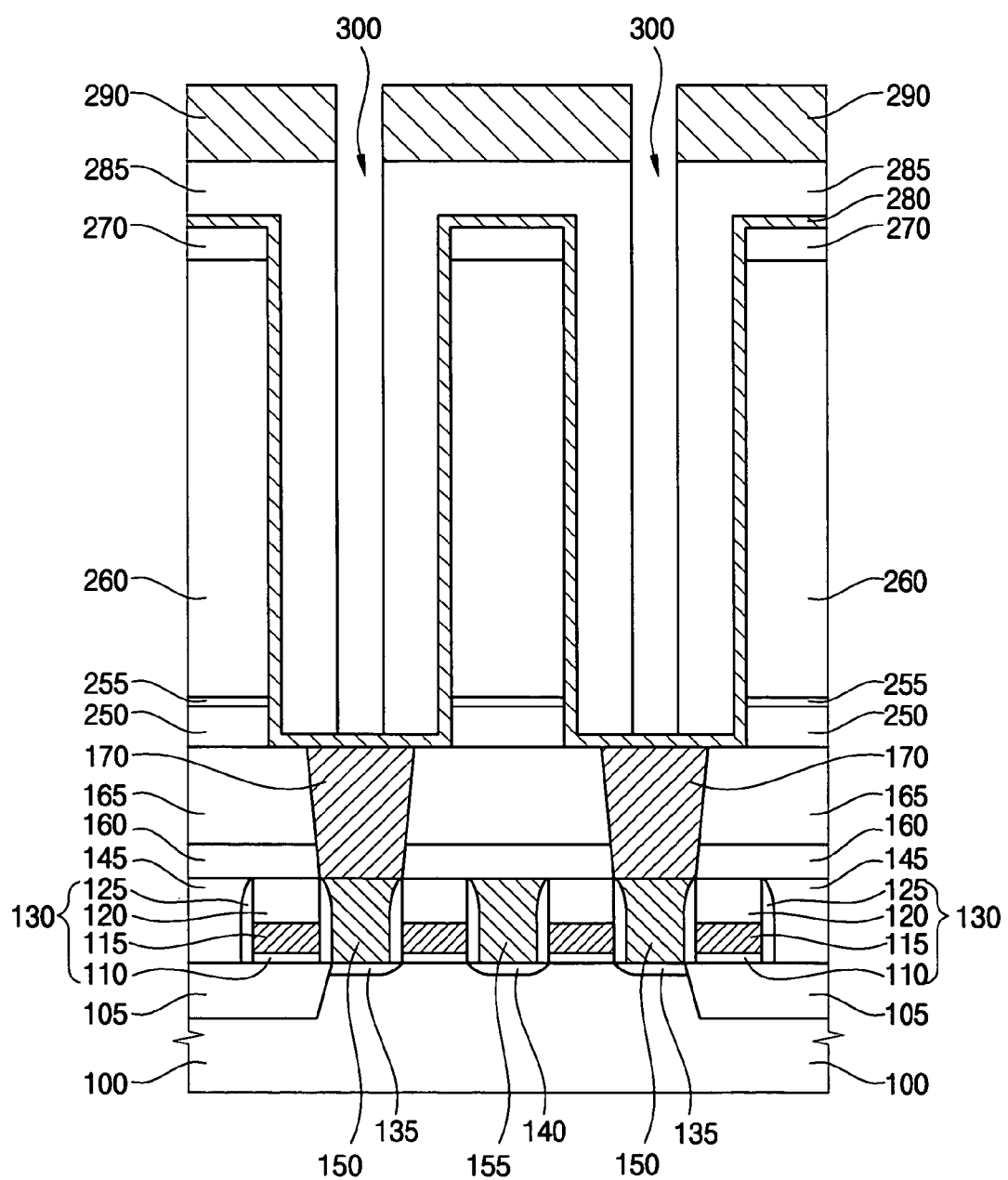
Figure 4D:
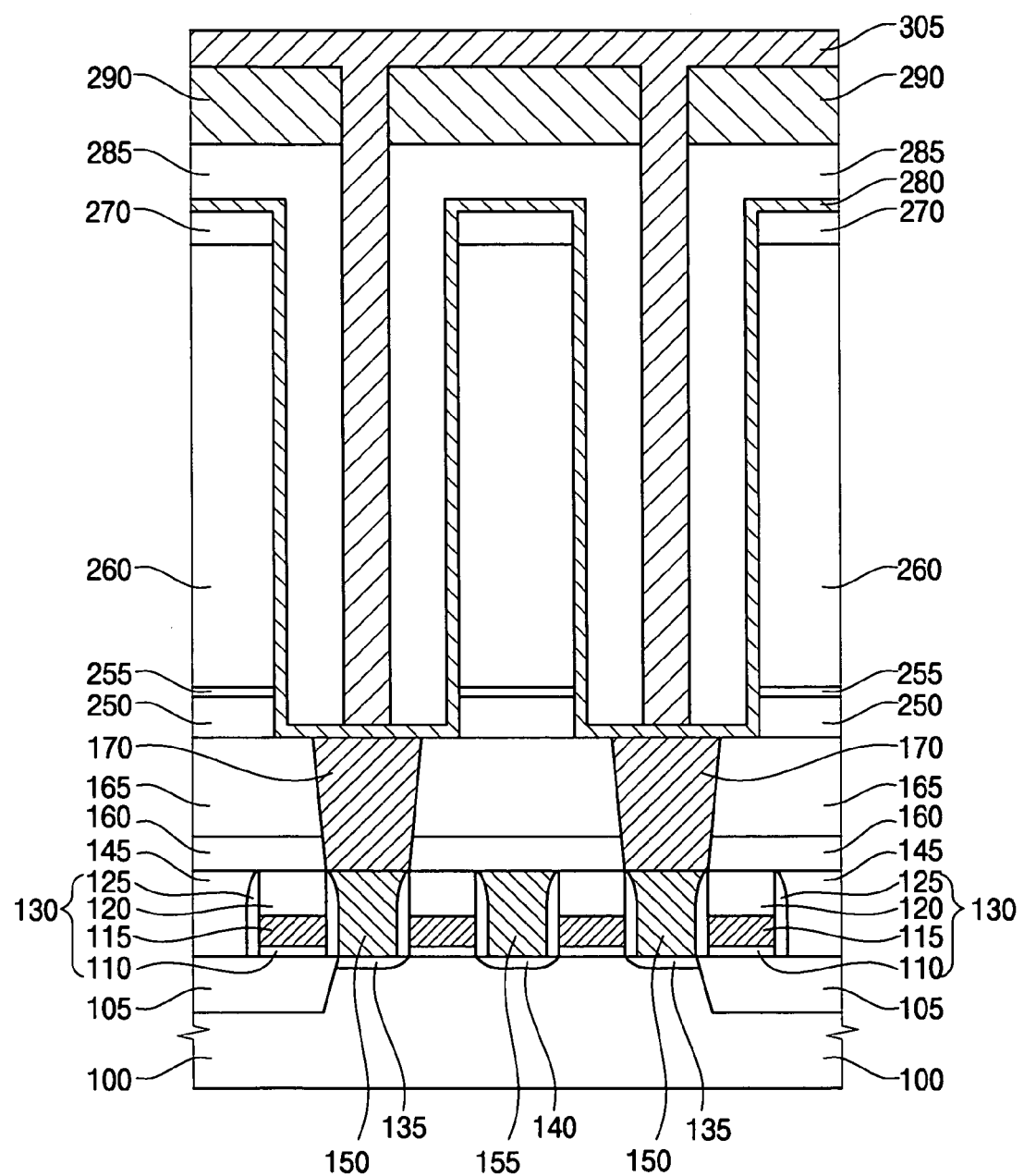
Figure 4E:
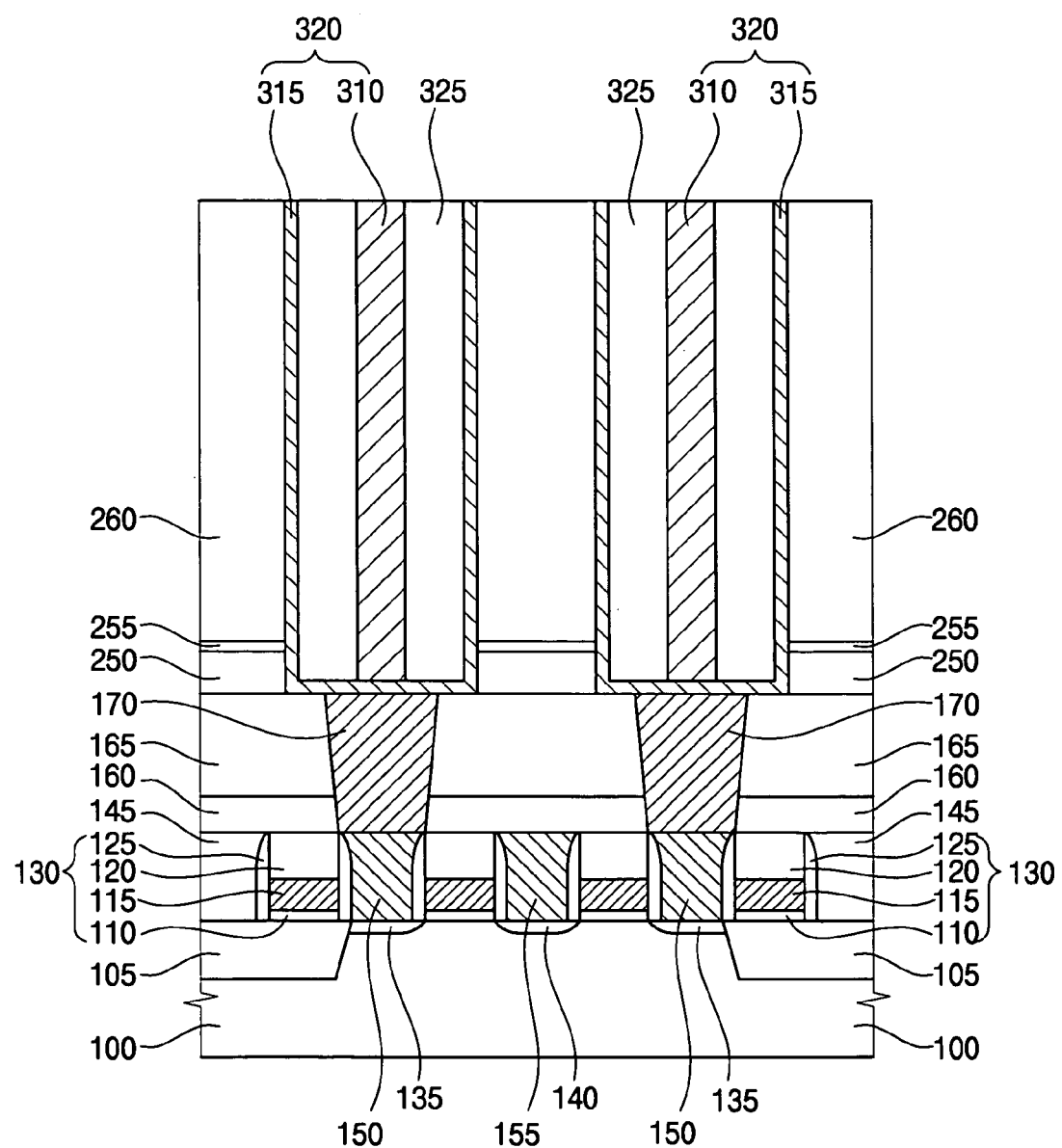

The mold layer 260 is formed on the etch stop layer 255 for forming storage electrodes 320 (see FIG. 4E). The mold layer 260 may be formed using TEOS, HDP-CVD oxide, PSG, USG, BPSG, SOG or any combination thereof. The mold layer 260 may have a thickness of from about 5,000 Å to about 50,000 Å measured from an upper face of the etch stop layer 255. The thickness of the mold layer 260 may vary in accordance with desired capacitance of capacitors 340 (see FIG. 4F). That is, because the capacitors 340 have the height in proportion to the thickness of the mold layer 260, the thickness of the mold layer 260 may be advantageously adjusted so as to control the capacitance of the capacitors 340.

A storage mask layer (not shown) is formed on the mold layer 260 using material that has an etching selectivity relative to the mold layer 260. For example, the storage mask layer is formed using nitride, polysilicon and the like. A photoresist film (not shown) is formed on the storage mask layer. The photoresist film is patterned to form a sixth photoresist pattern 265 on the mold layer 260. The sixth photoresist pattern 265 defines portions of the mold layer 260 where the storage electrodes 320 are formed therethrough. In some embodiments of the present invention, a third ARL (not shown) may be formed on the storage mask layer. Then, the sixth photoresist pattern 265 may be formed on the third ARL.

The storage mask layer is etched using the sixth photoresist pattern 265 as an etching mask to form a storage mask 270 on the mold layer 260. The storage mask 270 also defines the portions of the mold layer 260 where the storage electrodes 320 are formed. The sixth photoresist pattern 265 may be removed in the etching process for forming fourth contact holes 275. Alternatively, the sixth photoresist pattern 265 may be removed via an ashing and/or a stripping process.

Referring now to FIG. 4B, the mold layer 260, the etch stop layer 255 and the fourth insulating interlayer 250 are partially etched using the storage mask 270 as an etching mask to form the fourth contact holes 275. The fourth contact holes 275 expose the fourth pads 170, respectively. Here, one of the fourth contact holes 275 exposes one of the fourth pads 170. That is, one of the fourth contact holes 275 having a first diameter is formed on one of the fourth pads 170. A fifth conductive layer 280 is formed on the exposed upper face of the fourth pads 170, inner walls of the fourth contact holes 275 and the storage mask 270 using doped polysilicon or metal.

Referring now to FIG. 4C, a sacrificial layer 285 is formed on the fifth conductive layer 280 to fill the fourth contact holes 275. The sacrificial layer 285 is formed using a material having an etching selectivity relative to the mold layer 260 such as USG, SOG, and the like. The sacrificial layer 285 protects the storage electrodes 320 in a subsequent etching process. In some embodiments of the present invention, an upper face of the sacrificial layer 285 is planarized by a CMP process, an etch back process or a combination of a CMP process and an etch back process.

After a seventh photoresist pattern 290 is formed on the sacrificial layer 285, the sacrificial layer 285 is etched using the seventh photoresist pattern 290 as an etching mask to form fifth contact holes 300. The fifth contact holes 300 partially expose the fifth conductive layer 280 positioned on the fourth pads 170. Here, as the fifth contact holes 300 have a second diameter relatively smaller than the first diameters of the fourth contact holes 275, the fifth conductive layer 280 formed on the fourth pads 170 is partially exposed through the fifth contact holes 300.

Referring now to FIG. 4D, a sixth conductive layer 305 is formed on the exposed fifth conductive layer 280 and the seventh photoresist pattern 290 to cover the fifth contact holes 300. The sixth conductive layer 305 may be formed using doped polysilicon or metal. Thus, the sixth conductive layer 305 is electrically coupled to the fourth pads 170 through the fifth conductive layer 280. According to some embodiments of the present, the fifth conductive layer 280 is formed in the fourth contact holes 275 having the first diameter and the sixth conductive layer 305 is formed in the fifth contact holes 300 having the second diameter so that the storage electrode 320 having a matrix shape or a cylindrical shape is formed.

Referring now to FIG. 4E, the sixth conductive layer 305, the seventh photoresist pattern 290, the sacrificial layer 285, the fifth conductive layer 280 and the storage mask 270 are etched by a CMP process, an etch back process or a combination of a CMP process and an etch back process until the mold layer 260 is exposed. Thus, the storage electrodes 320 including fifth conductive patterns 315 contacting the fourth pads 170 and sixth conductive patterns 310 disposed on the fifth conductive patterns 315 are formed. The capacitor 320 according to some embodiments of the present invention may have a matrix shape or a multiple cylindrical shape wherein one of the fifth conductive patterns 315 is divided into a plurality of cylindrical conductive pattern portions by the sixth conductive pattern 310. Here, sacrificial patterns 325 remain in the gaps between the fifth conductive patterns 315 and the sixth conductive patterns 310.

Figure 4F:
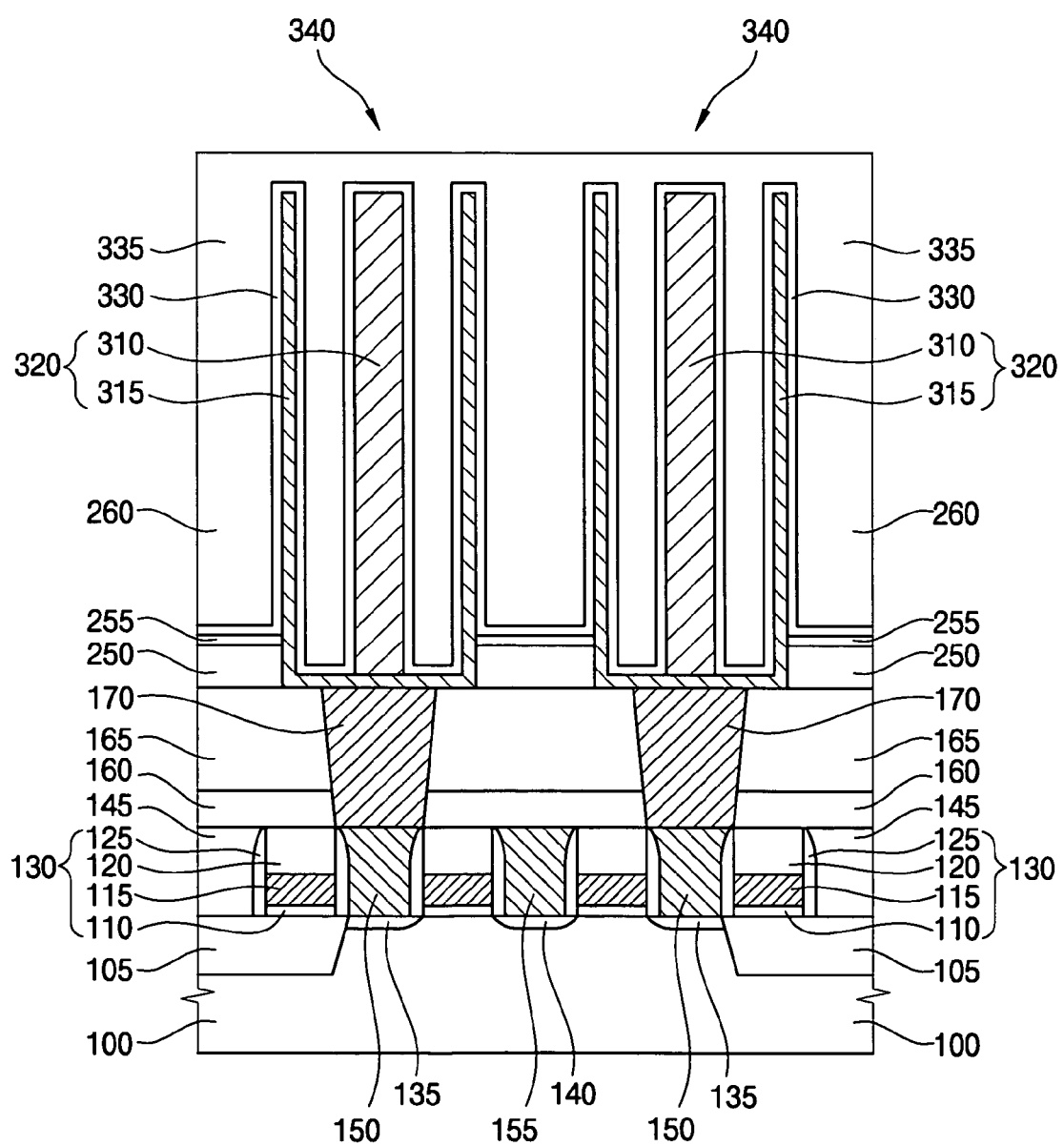

Referring now to FIG. 4F, the mold layer 260 and the sacrificial patterns 325 are etched to complete the storage electrodes 320. Then, a dielectric layer 330 and a plate electrode 335 are successively formed on the storage electrode 320 to complete the capacitor 340. As described above, the capacitor 340 according to embodiments of the present invention may have the storage electrode 320 including the cylindrical fifth conductive pattern 315 and the sixth conductive pattern 310 that divides the fifth conductive pattern 315 into conductive pattern portions. Hence, the capacitor 340 according to embodiments of the present invention illustrated in FIG. 4F may have an improved capacitance relative to that of conventional capacitors.

According to some embodiments of the present invention, a surface area of a storage electrode included in a capacitor is extended to increase capacitance of the capacitor. Generally, when a height of the capacitor is augmented, the capacitor may easily fall down. Thus, in order to increase the capacitance of the capacitor, decreasing a critical dimension (CD) of the storage electrode is more advantageous than increasing height of the capacitor. When krypton fluoride (Kef) laser or argon fluoride (ArF) laser is used in a photolithography process for forming a photoresist pattern, the storage electrode having the CD of less than or substantially equal to about 50 nm may be formed. Table 1 gives a ratio of increasing a surface area of the capacitor relative to an increase of a CD of the storage electrode shown in FIGS. 2 and 4F and a ratio of increasing the surface area of the capacitor relative to an increase of the height of the storage electrode.

TABLE 1

| CD of a storage electrode (nm) | ratio of increasing a surface area of capacitor in FIG. 2 (%) | height of a storage electrode (nm) | ratio of increasing a surface area of capacitor in FIG. 4F (%) | height of a storage electrode (nm) |
|---|---|---|---|---|
| 60 | 13.0 | 22,650 | 0.0 | 20,000 |
| 50 | 14.9 | 23,050 | 2.2 | 20,440 |
| 40 | 16.9 | 23,460 | 4.4 | 20,880 |
| 30 | 19.0 | 23,870 | 6.6 | 21,320 |

As illustrated in Table 1, when the CD of the storage electrode is reduced to about 50 mn, the ratio of increasing the surface area of the capacitor is about 14.9% in accordance with some embodiments of the present invention illustrated in FIG. 2, and about 2.2% in accordance with some embodiments of the present invention illustrated in FIG. 4F. In order to obtain substantially the same effect of increasing surface area of the capacitor as described above, a height of the capacitor having a structure shown in FIG. 2 is augmented by about 1,050 nm, and a height of the capacitor having a structure shown in FIG. 4F is augmented by about 440 nm. In addition, when the storage electrode has a conventional CD value of about 60 nm, the ratio of increasing surface area of the capacitor is about 13.0% in accordance with some embodiments of the present invention illustrated in FIG. 2.

When the CDs of the storage electrodes are reduced to about 40 nm and 30 nm, respectively, the ratios of increasing surface area of the capacitors are about 16.9% and about 19.0%, respectively, in accordance with some embodiments of the present invention illustrated in FIG. 2, and about 4.4% and about 6.6%, respectively, in accordance with some embodiments of the present invention illustrated in FIG. 4F. On the other hand, in order to obtain substantially the same effects of increasing surface area of the capacitors as described above by increasing heights of the capacitors, heights of the capacitor having structures shown in FIG. 2 are augmented by about 1,460 nm and about 1,870 nm, respectively, and heights of the capacitors having structures shown in FIG. 4F are augmented by about 880 nm and about 1,320 nm, respectively. Thus, in order to increase the capacitance of the capacitor, increasing the surface area of the storage electrode is more advantageous than increasing the height of the capacitor.

FIGS. 5A to 5E are cross-sections illustrating processing steps in the fabrication of capacitors having a matrix shape or a multiple cylindrical shape in accordance some embodiments of the present invention. The processing steps in the fabrication of the fourth pads 170 are similar to those discussed with respect to FIG. 3A, therefore, details with respect to these processing steps will not be discussed further herein.

Figure 5A:
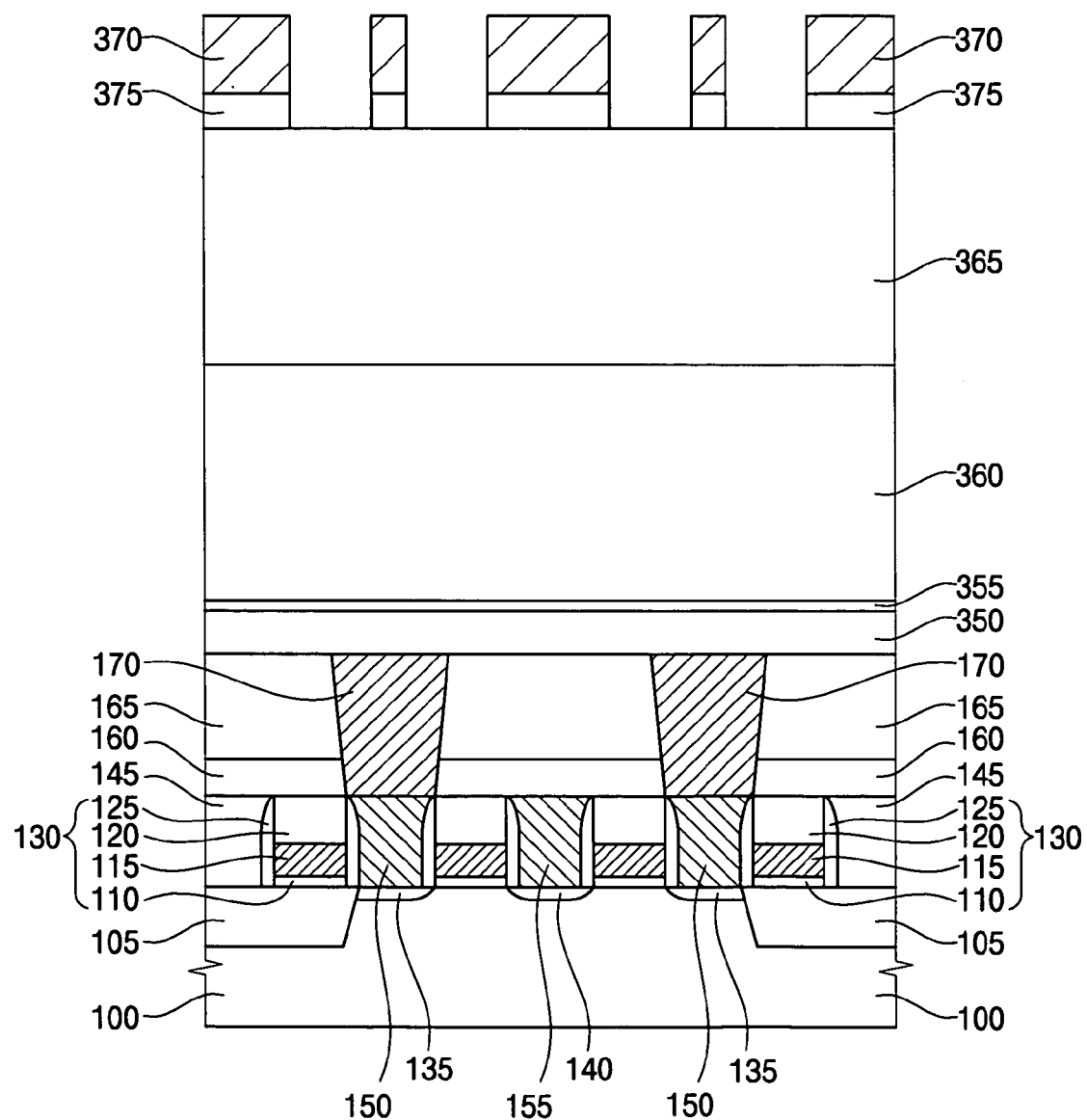
FIGS. 5A to 5E are cross-sections illustrating processing steps in the fabrication of capacitors according to still further embodiments of the present invention.

Referring now to FIG. 5A, a fourth insulating interlayer 350 is formed on a fourth pad 170 and a third insulating interlayer 165 using BPSG, PSG, USG, TEOS, SO, HDP-CVD oxide, and the like. The fourth insulating interlayer 350 may be formed using material substantially identical to that of the third insulating interlayer 165 and/or a second insulating interlayer 160. Alternatively, in some embodiments of the present invention, the fourth insulating interlayer 350 may include material different from that of the third insulating interlayer 165 and/or the second insulating interlayer 160.

An etch stop layer 355 is formed on the fourth insulating interlayer 350. The etch stop layer 355 is formed using material having an etching selectivity relative to a first and a second mold layers 360 and 365 successively formed and the fourth insulating interlayer 350. For example, the etch stop layer 355 is formed using nitride such as silicon nitride.

Figure 5B:
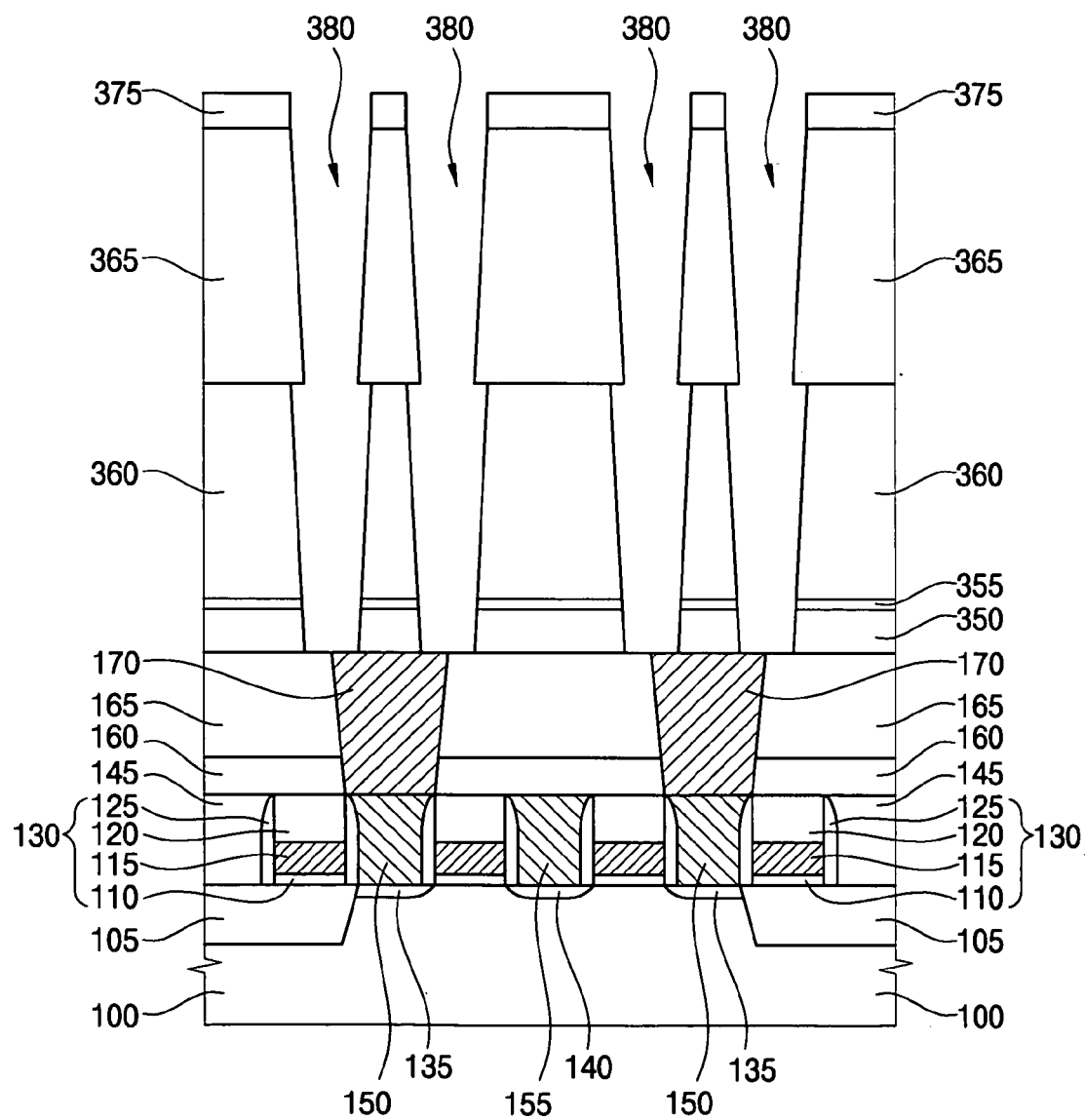
Figure 5C:
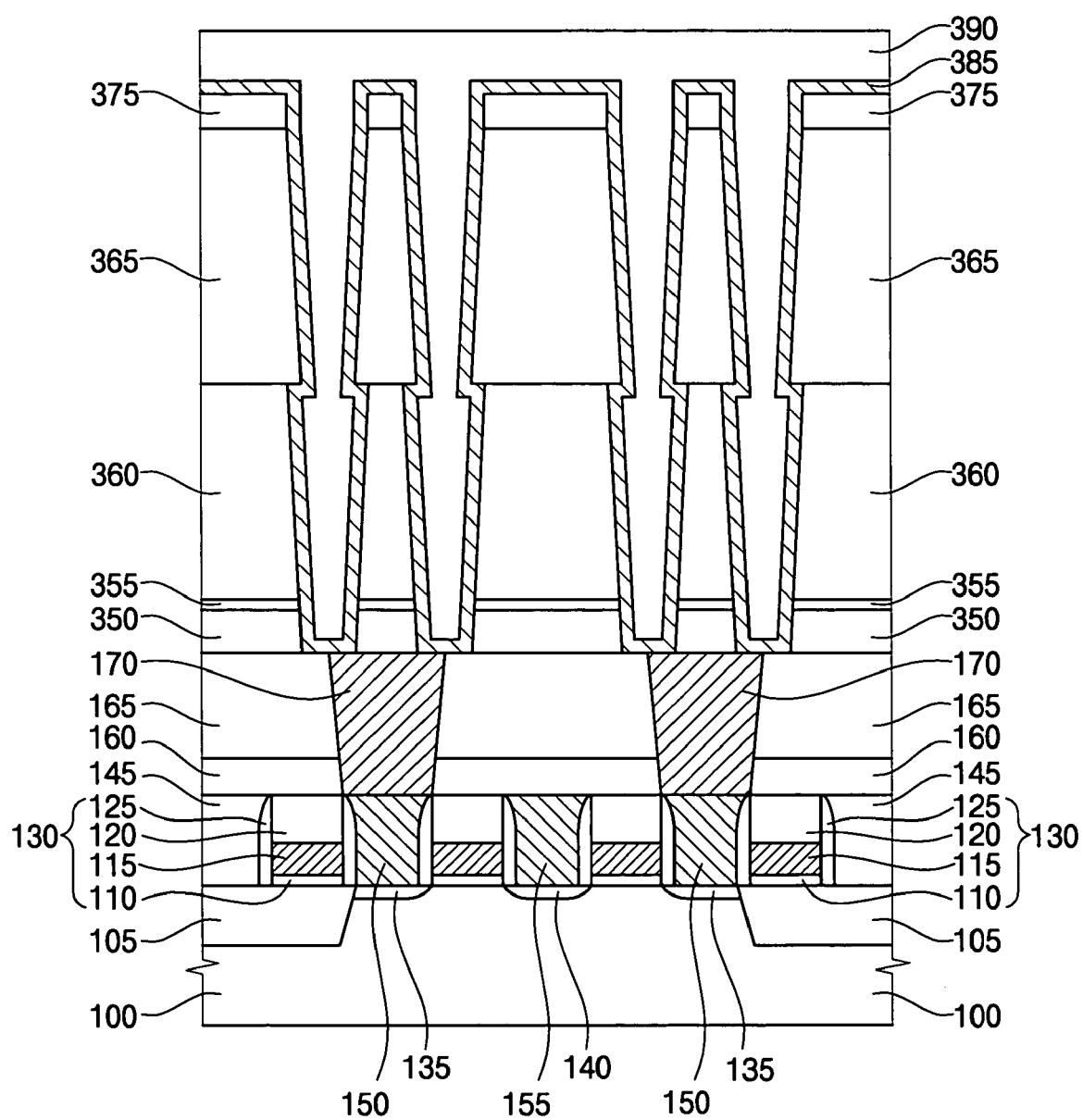
Figure 5D:
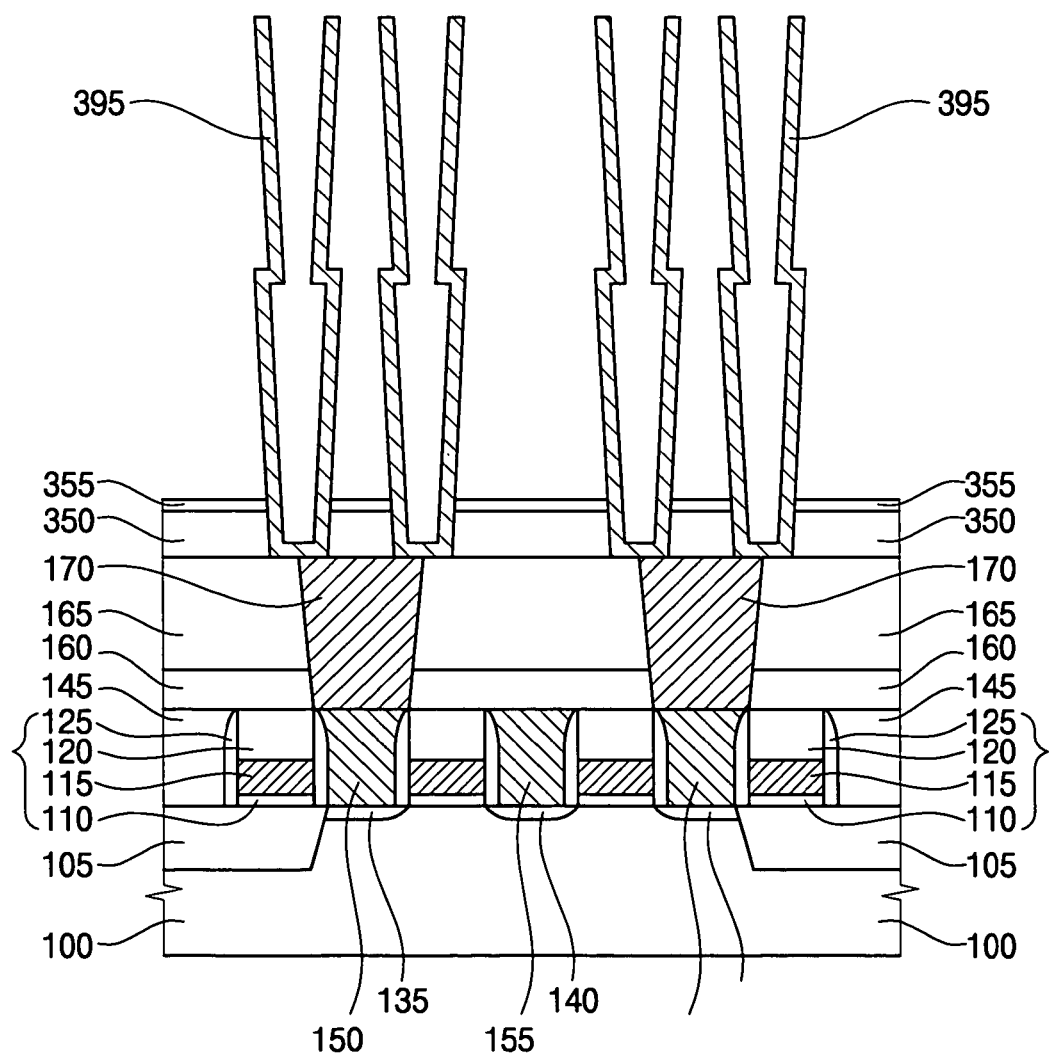

The first and the second mold layers 360 and 365 are successively formed on the etch stop layer 355 for forming storage electrodes 395 (see FIG. 5D). A total thickness of the first and the second mold layers 360 and 365 may be from about 5,000 Å to about 50,000 Å measured from an upper face of the etch stop layer 355. A thickness of the first mold layer 360 may be substantially identical to that of the second mold layer 365. According to some embodiments of the present invention, the first mold layer 360 may be formed using oxide that includes impurities of a first concentration, and the second mold layer 365 may be formed using oxide without impurities or oxide that includes impurities of a second concentration. For example, the first mold layer 360 may be formed using BPSG or PSG including impurities, such as boron or phosphorus by the first concentration, whereas the second mold layer 365 may be formed using USG or TEOS without impurities, or BPSG or PSG including impurities, such as boron or phosphorus by the second concentration. Here, an impurity concentration of the second mold layer 365 is higher than that of the first mold layer 360. Thus, the first mold layer 360 is etched more rapidly than the second mold layer 365 in a subsequent etching process. An etchant containing hydrogen fluoride (HF) or an etchant containing ammonium hydroxide (NH4OH), hydrogen peroxide (H2O2) and deionized water (H2O) may be used in the etching process.

In some embodiments of the present invention, the first mold layer 360 may be etched more rapidly than the second mold layer 365 in a dry etching process that successively uses a first etching gas including hydrogen fluoride and water vapor and a second etching gas including carbon tetrafluoride (CF4) and oxygen (O2). Because the first mold layer 360 is more rapidly etched than the second mold layer 365 in accordance with their impurity concentrations, fourth contact holes 380 (see FIG. 5B) having reverse pyramid-shaped cross sections are formed.

Referring now to FIG. 5A, after a storage mask layer (not shown) and a photoresist film (not shown) are successively formed on the second mold layer 365, the photoresist film is patterned to form a sixth photoresist pattern 370 on the storage mask layer. In some embodiments of the present invention, an additional ARL may be formed between the storage mask layer and the photoresist film. The storage mask layer is etched using the sixth photoresist pattern 370 as an etching mask to form a storage mask 375. The storage mask 375 defines portions of the first and second mold layers 360 and 365 where the storage electrodes 395 are formed therethrough.

Referring now to FIG. 5B, the second mold layer 365 and the first mold layer 360 are successively etched using the storage mask 375 as an etching mask to form the fourth contact holes 380 exposing the fourth pads 170. Here, at least two fourth contact holes 380 expose one of the fourth pads 170. Namely, each of the fourth contact holes 380 partially exposes the fourth pads 170, respectively. For example, two, four, six, nine, twelve, fifteen, twenty, twenty five or more fourth contact holes 380 are formed to expose one of the fourth pads 170 in accordance with a structure of the storage mask 375 as described above. In addition, since the first mold layer 360 is more rapidly etched than the second mold layer 365 in the step for forming the fourth contact holes 380, the fourth contact holes 380 may be accurately formed, thereby advantageously exposing the fourth pads 170. That is, in the step for forming the fourth contact holes 380 exposing the fourth pads 170, the fourth pads 170 may be advantageously exposed without decrease of an etched amount of the first mold layer 360 because the first mold layer 360 is more rapidly etched than the second mold layer 365. Thus, the fourth contact holes 380 have the reverse pyramid-shaped cross sections. Here, the fourth contact holes 380 are formed by an etching process of the first and the second mold layer 360 and 365 having different etching selectivities to each other, respectively.

Referring now to FIG. 5C, a fifth conductive layer 385 is formed on the exposed upper face of the fourth contact pads 170, inner walls of the fourth contact holes 380 and the storage node mask 375. The fifth conductive layer 385 may be formed using doped polysilicon or metal. As at least two fourth contact holes 380 electrically coupled to one of the fourth pads 170 are formed, at least two portions of one of the fourth pads 170 contact the fifth conductive layer 385.

A sacrificial layer 390 is formed on the fifth conductive layer 385 in the fourth contact holes 380. The sacrificial layer 390 may be formed using material having an etching selectivity relative to the first and the second mold layers 360 and 365. That is, the sacrificial layer 390 may be formed using PSG, BPSG, USG, or SOG having impurities of a third concentration.

Referring now to FIG. 5D, the sacrificial layer 390, the fifth conductive layer 385 and the storage mask 375 are etched by a CMP process, an etch back process or a combination of a CMP process and an etch back process until the second mold layer 365 is exposed, thereby forming the storage electrode 395 including conductive patterns that respectively contact one of the fourth pads 170. In some embodiments of the present invention, the storage electrode 395 also has a reverse pyramid structure in accordance with that of the fourth contact hole 380 having the reverse pyramid-shaped cross section. Here, the sacrificial pattern (not shown) remains inside of the storage electrode 395. The sacrificial pattern, the second mold layer 365 and the first mold layer 360 are successively removed to complete storage electrode 395 including a plurality of conductive patterns respectively contacting one of the fourth pads 170.

Figure 5E:
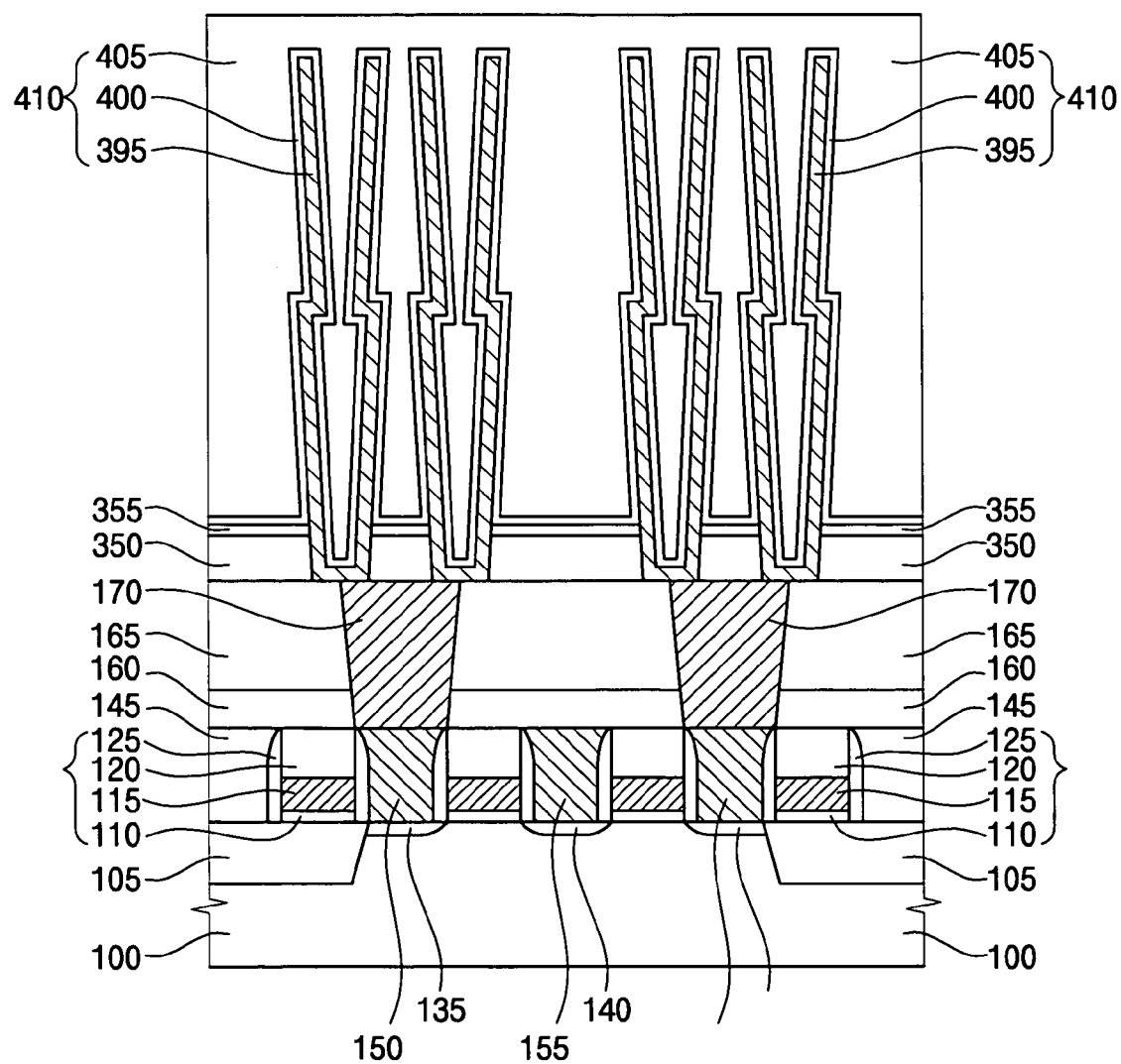

Referring now to FIG. 5E, a dielectric layer 400 and a plate electrode 405 are successively formed on the storage electrode 395 to complete a capacitor 410. As described above, the capacitor 410 according to some embodiments of the present invention includes at least two storage electrodes 395 having a reverse pyramid shape electrically coupled to one of the fourth pads 170. As the capacitor 410 includes storage electrode 395 having a matrix shape or a multiple cylindrical shape, the capacitor 410 may have an improved capacitance relative to that of a conventional capacitor.

Figure 6:
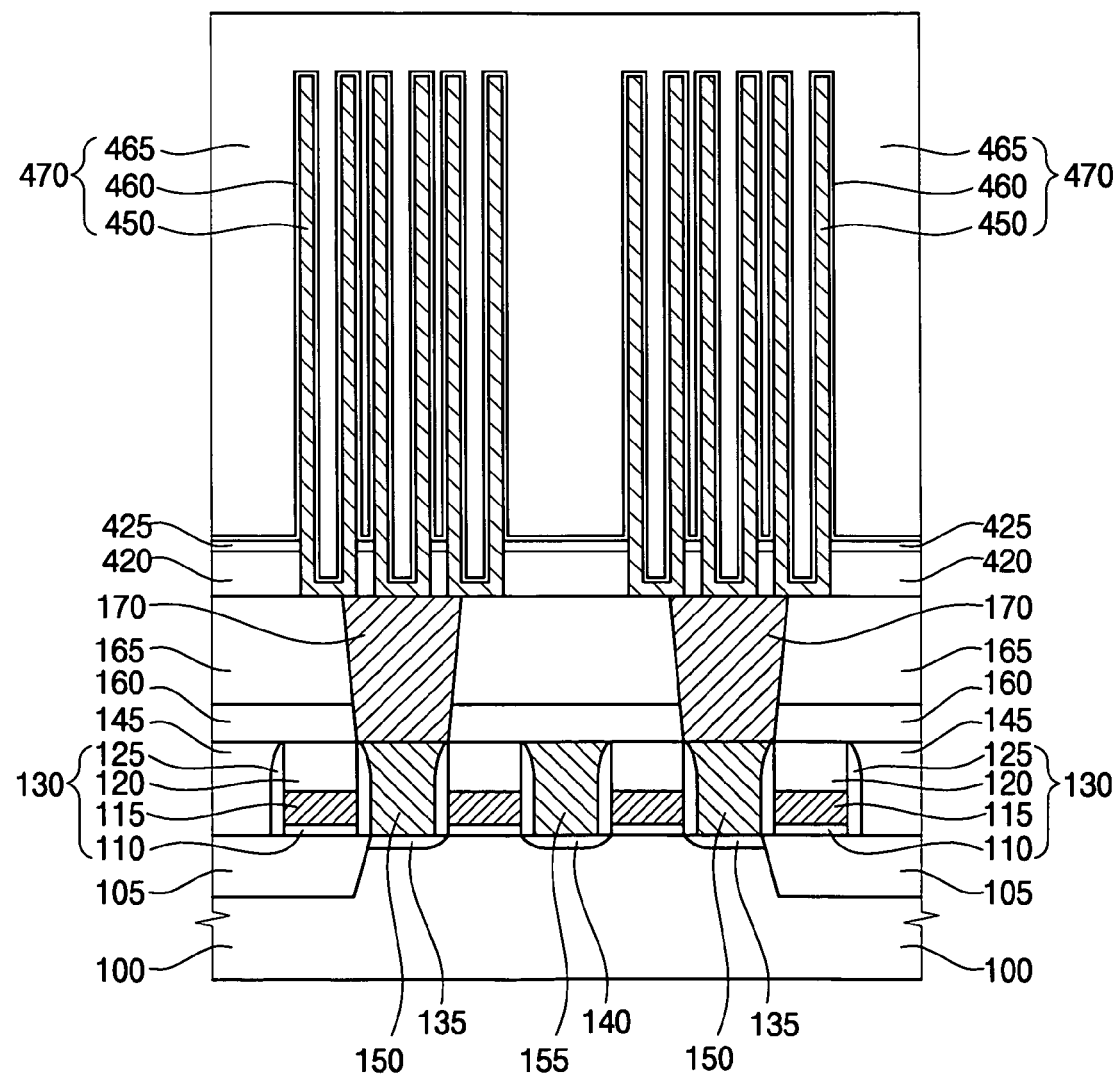
FIG. 6 is a cross-section illustrating capacitors according to some embodiments of the present invention.

FIG. 6 is a cross-section illustrating a capacitor having a matrix shape in accordance with some embodiments of the present invention. Conductive structures including gate structures, bit lines, first pads and second pads formed on a substrate are substantially similar to those described above with respect to FIG. 2, therefore, details with respect to the conductive structures will not be discussed in detail further herein.

Referring now to FIG. 6, a capacitor 470 is formed on a substrate 100 including the conductive structures. The capacitor 470 includes a storage electrode 450 including a plurality of cylindrical conductive patterns, a dielectric layer 460 formed on the storage electrode 450 and a plate electrode 465 formed on the dielectric layer 450.

The storage electrode 450 has a matrix shape or a multiple cylindrical shape. Here, the cylindrical conductive patterns may be arranged on the substrate 100 to have a matrix shape, or a multiple cylindrical shape in which one cylindrical conductive pattern of relatively large diameter encloses another cylindrical conductive pattern of relatively small diameter. The cylindrical conductive patterns contact one of the fourth pads 170. Thus, the storage electrode 450 including the cylindrical conductive patterns is electrically coupled to the contact region through the fourth and the first pads 170 and 150.

FIGS. 7A through 7D are cross-sections illustrating processing steps in the fabrication of capacitors according to some embodiments of the present invention illustrated in FIG. 6. Processing steps in the fabrication of the fourth pads 170 are similar to those discussed above with respect to FIG. 3A, therefore, details with respect to the processing steps will not be discussed in further detail herein.

Figure 7A:
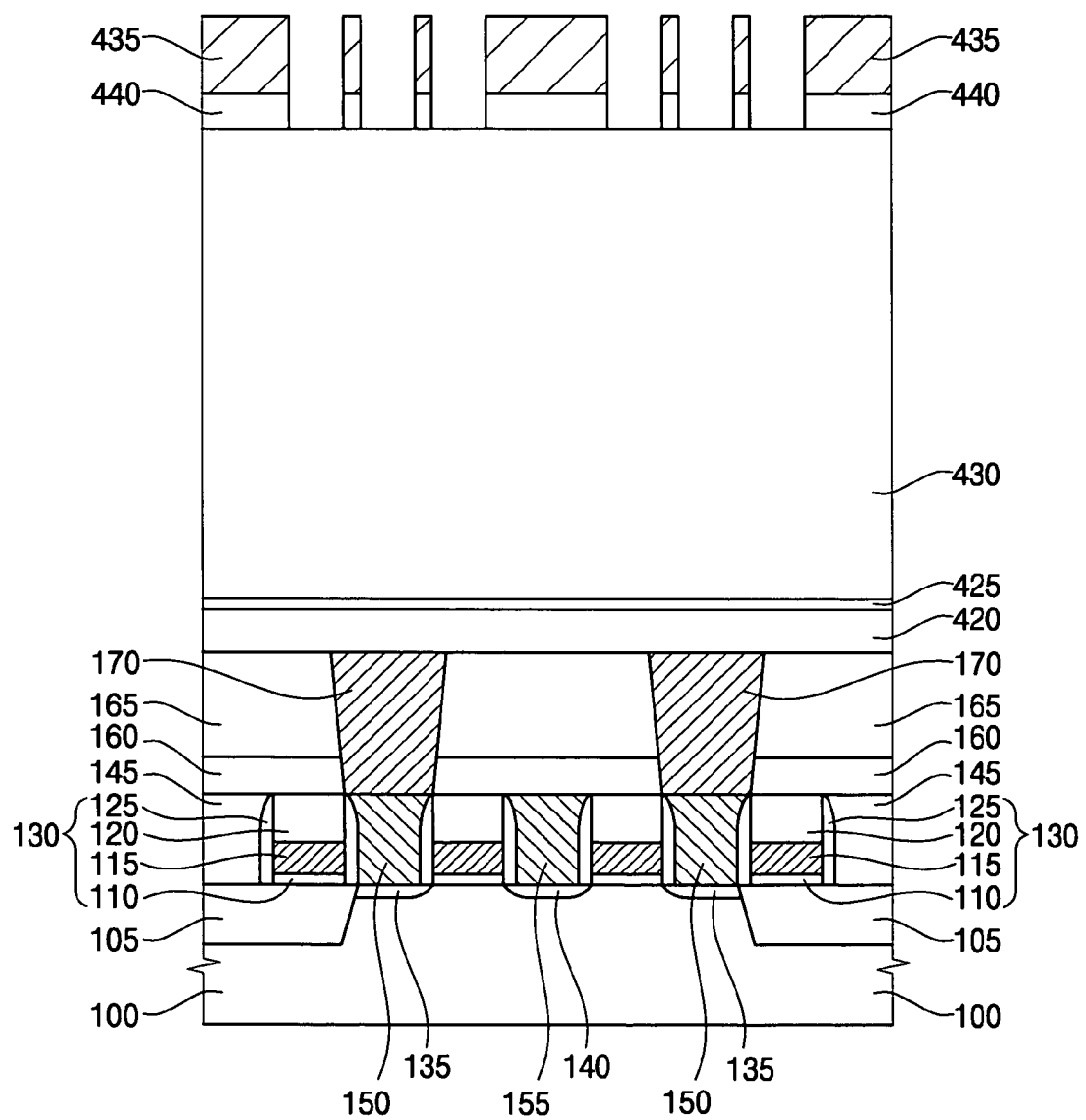
FIGS. 7A to 7D are cross-sections illustrating processing steps in the fabrication of capacitors according to embodiments of the present invention illustrated in FIG. 6.

Referring now to FIG. 7A, a fourth insulating interlayer 420 including oxide and an etch stop layer 425 including nitride are successively formed on fourth pads 170 and third insulating interlayer 165. A mold layer 430 including oxide for forming a storage electrode 450 (see FIG. 7C) is formed on the etch stop layer 425. A storage mask layer (not shown) and a photoresist film (not shown) are successively formed on the mold layer 430. The storage mask layer may be formed using material having an etching selectivity relative to the mold layer 430.

The photoresist film is patterned to form a sixth photoresist pattern 435 on the storage mask layer. The storage mask layer is etched using the sixth photoresist pattern 435 as an etching mask to form a storage mask 440 on the mold layer 430. Here, the storage mask 440 defines portions of the mold layer 430 where the storage electrodes 450 are formed therethrough.

Figure 7B:
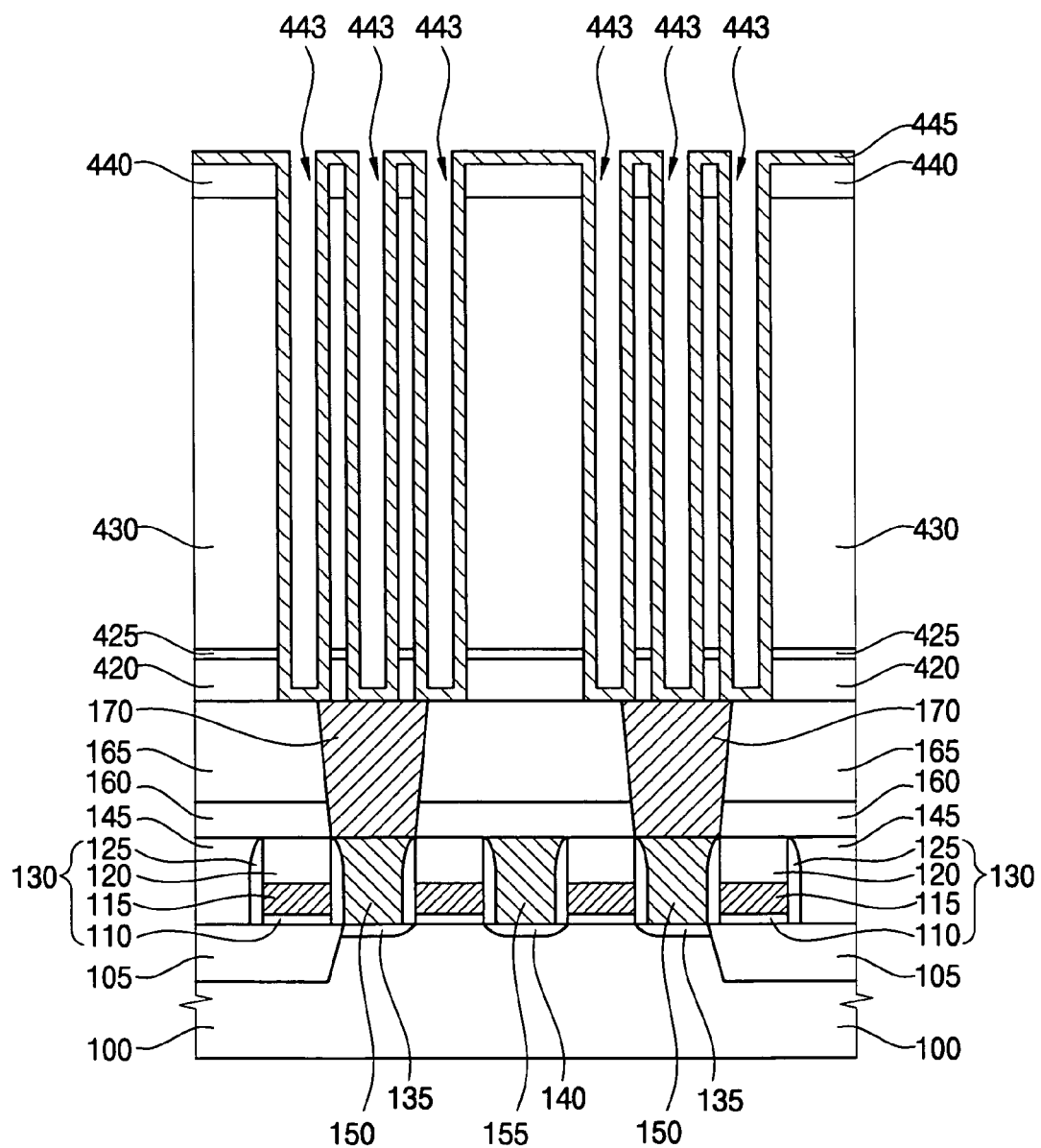

Referring now to FIG. 7B, the mold layer 430, the etch stop layer 425 and the fourth insulating interlayer 420 are partially etched using the storage mask 440 as an etching mask to form fourth contact holes 443 exposing the fourth pads 170. Here, a plurality of the fourth contact holes 443 partially exposes one of the fourth pads 170. That is, a plurality of the fourth contact holes 443 respectively exposes corresponding portions of one of the fourth pads 170.

A fifth conductive layer 445 is formed on upper faces of the exposed fourth pads 170, inner walls of the fourth contact holes 443 and the storage mask 440 using doped polysilicon or metal. In some embodiments of the present invention, since a plurality of the fourth contact holes 443 are formed on one of the fourth pads 170, each portions of the fifth conductive layer 445 contacts the corresponding portions of the fourth pad 170.

Figure 7C:
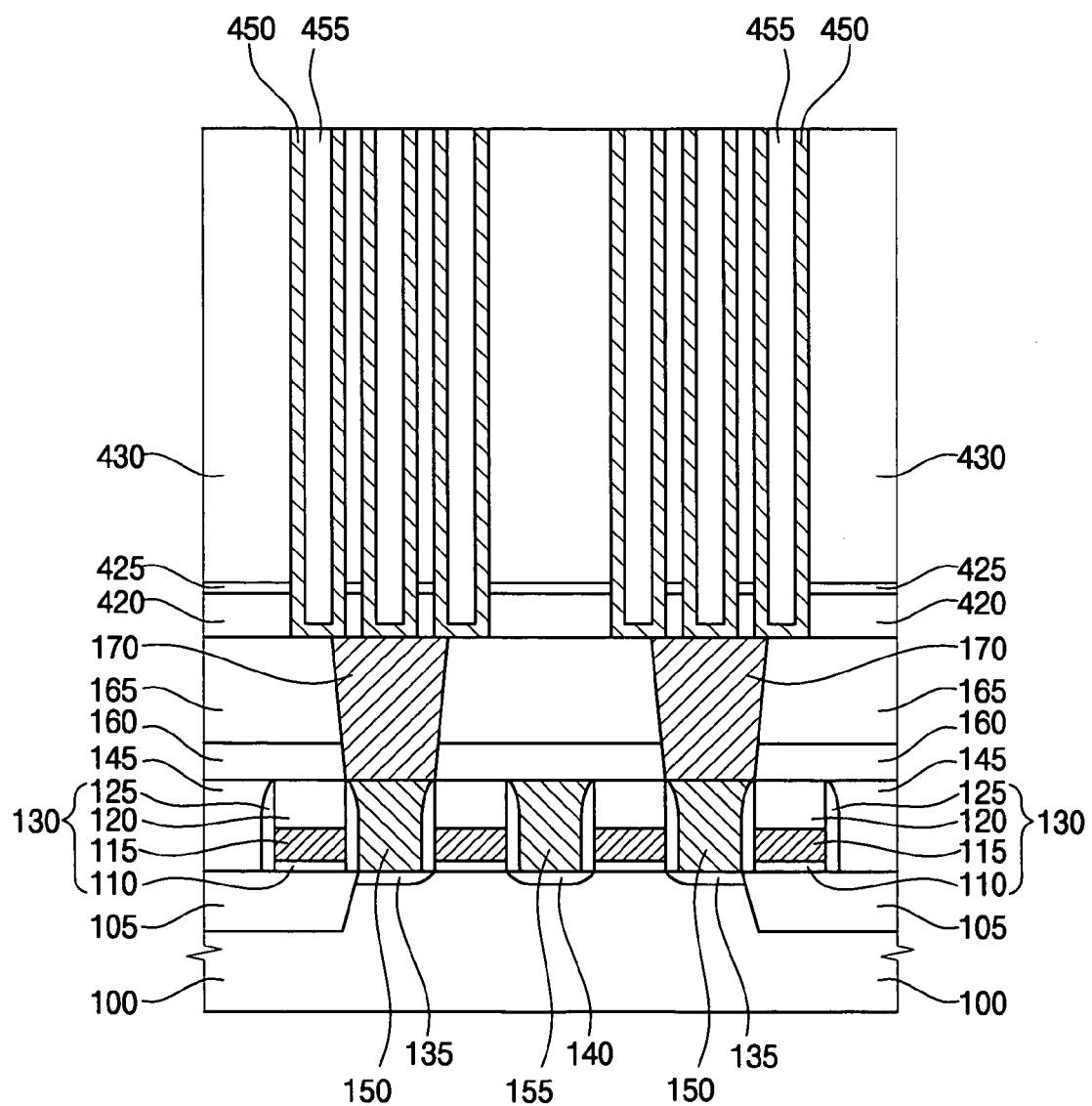

Referring now to FIG. 7C, a sacrificial layer (not shown) is formed on the fifth conductive layer 445 to fill the fourth contact holes 443 using material having an etching selectivity relative to the mold layer 430. The sacrificial layer, the fifth conductive layer 445 and the storage mask 440 are etched until the mold layer 430 is exposed by a CMP process, an etch back process or a combination of a CMP process and an etch back process. Thus, the storage electrode 450 including a plurality of cylindrical conductive patterns is formed. Here, the cylindrical conductive patterns are respectively coupled to one of the fourth pads 170. Each of the conductive patterns of the storage electrode 450 is covered with a sacrificial pattern 455.

Figure 7D:
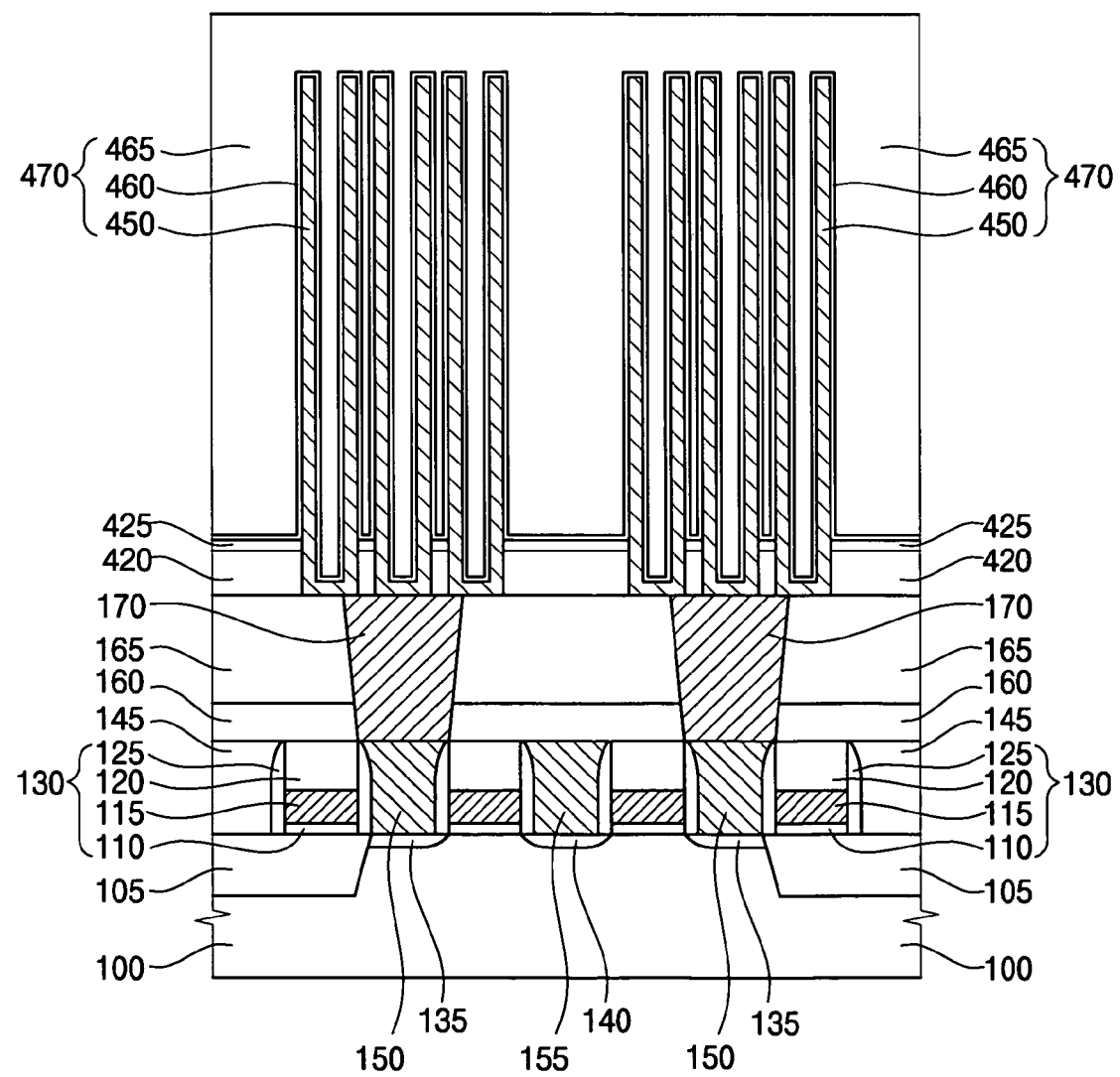

Referring now to FIG. 7D, the mold layer 430 and the sacrificial patterns 455 are etched to complete storage electrodes 450. Then, a dielectric layer 460 and a plate electrode 465 are successively formed on the storage electrodes 450 to complete a capacitor 470. As described above, the capacitor 470 of the present embodiment may have the storage electrode 450 including a plurality of the conductive patterns contacting one of the fourth pads 170. Hence, the capacitor 470 may have an improved capacitance relative to that of a conventional capacitor. Here, the conductive patterns are arranged to have a matrix shape or a multiple cylindrical shape.

As discussed briefly above, according to some embodiments of the present invention, a storage electrode including a plurality of the conductive patterns arranged to have a matrix shape or a multiple cylindrical shape is formed by simply altering a design in a photolithography process. Thus, a surface area of the storage electrode may be extended by a simple process with a relatively low cost so that a capacitance of a capacitor may be improved.

In addition, the capacitor includes a plurality of the cylindrical conductive patterns respectively contacting corresponding portions of one of the conductive pads. Thus, when some conductive patterns are partially shorted, the likelihood of deterioration of the capacitor may be decreased by the other conductive patterns.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a capacitor comprising:
    forming a storage node contact pad;
    forming a semiconductor substrate including a contact region, the storage node contact pad being electrically coupled to the contact region of the substrate;
    forming a mold layer on the semiconductor substrate;
    etching the mold layer to form the contact holes respectively exposing at least a portion of corresponding portions of the storage node contact pad;
    forming a storage electrode including at least two cylindrical conductive patterns, the at least two cylindrical conductive patterns being electrically coupled to the storage node contact pad;
    forming a dielectric layer on the conductive patterns; and
    forming a plate electrode on the dielectric layer, wherein forming the storage electrode comprises:
        forming a conductive layer on the mold layer, the storage node contact pad and the inner walls of the contact holes;
        forming a sacrificial layer on the conductive layer in the contact holes; and
        partially removing the sacrificial layer and the conductive layer until the mold layer is exposed such that the storage electrode includes at least two conductive patterns on the storage node contact pad and inner walls of contact holes.

2. The method of claim 1, wherein the contact holes have a matrix shape or a multiple cylindrical shape relative to the pad.

3. The method of claim 1, wherein forming the contact holes further comprises:
    forming a photoresist pattern defining portions of the mold layer where the contact holes are formed; and
    etching the mold layer using the photoresist pattern as a mask.

4. The method of claim 3, wherein forming the photoresist pattern further comprises:
    forming a mask layer on the mold layer using material having an etching selectivity relative to the mold layer;
    etching the mask layer using the photoresist pattern to form a mask defining the portions of the mold layer where the contact holes are formed; and
    etching the mold layer using the mask.

5. The method of claim 4, wherein forming the mold layer further comprises:
forming a first mold layer on the substrate; and
forming a second mold layer on the first mold layer using material having an etching selectivity relative to the mold layer and the mask layer.

6. The method of claim 4, wherein each of the contact holes has a pyramid-shaped cross section.

7. A method of forming a capacitor comprising:
forming a contact region on a substrate;
forming a pad contacting the contact region;
forming a mold layer on the substrate;
etching the mold layer to form a first contact hole exposing the pad;
forming a first conductive layer on an upper face of the pad and an inside of the first contact hole;
forming a sacrificial layer on the first conductive layer in the first contact hole;
forming a second contact hole exposing the first conductive layer in the sacrificial layer;
forming a second conductive layer on the sacrificial layer in the second contact hole;
partially removing the second conductive layer, the sacrificial layer and the first conductive layer to form a storage electrode, wherein the storage electrode includes a first conductive pattern contacting the pad, and a second conductive pattern dividing the first conductive pattern into a plurality of portions;
forming a dielectric layer on the first and the second conductive patterns; and
forming a plate electrode on the dielectric layer.

8. The method of claim 7, wherein forming the first contact hole further comprises:
forming a first photoresist pattern on the mold layer; and
etching the mold layer using the first photoresist pattern.

9. The method of claim 8, wherein forming the first contact hole further comprises:
forming a mask layer between the mold layer and the first photoresist pattern;
etching the mask layer using the first photoresist pattern as an etching mask to form a mask; and
etching the mold layer using the mask.

10. The method of claim 8, wherein forming the second contact hole further comprises:
forming a second photoresist pattern on the sacrificial layer; and
etching the sacrificial layer using the second photoresist pattern.

11. The method of claim 8, wherein the first contact hole encloses the second contact hole.

* * * * *